US009243345B2

(12) United States Patent
Ono et al.

(10) Patent No.: US 9,243,345 B2
(45) Date of Patent: Jan. 26, 2016

(54) SILICON WAFER AND MANUFACTURING METHOD THEREOF

(71) Applicant: SUMCO CORPORATION, Tokyo (JP)

(72) Inventors: Toshiaki Ono, Tokyo (JP); Wataru Ito, Tokyo (JP); Jun Fujise, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/518,594

(22) Filed: Oct. 20, 2014

(65) Prior Publication Data
US 2015/0054134 A1 Feb. 26, 2015

Related U.S. Application Data

(62) Division of application No. 13/258,962, filed as application No. PCT/JP2010/002117 on Mar. 25, 2010, now Pat. No. 8,890,291.

(30) Foreign Application Priority Data

Mar. 25, 2009 (JP) ................. 2009-074837
Mar. 25, 2009 (JP) ................. 2009-075001
Mar. 25, 2009 (JP) ................. P2009-074836
Apr. 14, 2009 (JP) ................. 2009-098262

(51) Int. Cl.
H01L 21/02 (2006.01)
C30B 33/02 (2006.01)
(Continued)

(52) U.S. Cl.
CPC ............... *C30B 33/02* (2013.01); *C30B 23/025* (2013.01); *C30B 25/186* (2013.01); *C30B 29/06* (2013.01); *H01L 21/3225* (2013.01); *H01L 21/67115* (2013.01); *H01L 21/68735* (2013.01);
(Continued)

(58) Field of Classification Search
CPC ...... C30B 25/186; C30B 29/06; C30B 33/02; H01L 21/3225; H01L 21/67115; H01L 21/68735; H01L 29/16; H01L 29/167; H01L 29/36; Y10S 438/918
USPC ........... 257/607; 438/407, 520, 528, 548, 918
See application file for complete search history.

(56) References Cited

U.S. PATENT DOCUMENTS 4,851,358 A 7/1989 Huber
6,143,071 A * 11/2000 Aihara ............... C30B 33/00
117/1

(Continued)

FOREIGN PATENT DOCUMENTS

DE 102006005875 8/2006
EP 1087041 3/2001
(Continued)

OTHER PUBLICATIONS

Search report from International Application No. PCT/JP2010/002117, mail date is Jun. 29, 2010.
(Continued)

*Primary Examiner* — Mohammed Shamsuzzaman
(74) *Attorney, Agent, or Firm* — Greenblum & Bernstein, P.L.C.

(57) ABSTRACT

A method of manufacturing a silicon wafer provides a silicon wafer which can reduce the precipitation of oxygen to prevent a wafer deformation from being generated and can prevent a slip extension due to boat scratches and transfer scratches serving as a reason for a decrease in wafer strength, even when the wafer is provided to a rapid temperature-rising-and-falling thermal treatment process.

8 Claims, 9 Drawing Sheets

(51) Int. Cl.
| | |
|---|---|
| *C30B 29/06* | (2006.01) |
| *H01L 21/322* | (2006.01) |
| *H01L 21/67* | (2006.01) |
| *H01L 21/687* | (2006.01) |
| *C30B 23/02* | (2006.01) |
| *C30B 25/18* | (2006.01) |
| *H01L 29/16* | (2006.01) |
| *H01L 29/167* | (2006.01) |
| *H01L 29/36* | (2006.01) |

(52) U.S. Cl.
CPC .............. *H01L29/16* (2013.01); *H01L 29/167* (2013.01); *H01L 29/36* (2013.01); *Y10S 438/918* (2013.01)

(56) References Cited

U.S. PATENT DOCUMENTS

| | | | | | |
|---|---|---|---|---|---|
| 6,162,708 | A * | 12/2000 | Tamatsuka | ............... | C30B 15/00 148/33 |
| 6,238,990 | B1 * | 5/2001 | Aga | ................... | H01L 21/3226 257/E21.32 |
| 6,264,906 | B1 * | 7/2001 | Aihara | ................... | C30B 33/00 423/328.2 |
| 6,478,883 | B1 * | 11/2002 | Tamatsuka | ............... | C30B 15/00 117/20 |
| 6,544,656 | B1 | 4/2003 | Abe et al. | | |
| 6,569,535 | B2 * | 5/2003 | Murakami | ............... | C30B 15/14 117/932 |
| 6,599,815 | B1 * | 7/2003 | Yang | ................... | H01L 21/3225 257/E21.321 |
| 6,599,816 | B2 * | 7/2003 | Sueoka | ................... | C30B 25/02 257/E21.321 |
| 7,182,809 | B2 * | 2/2007 | Haga | ..................... | C30B 15/203 117/19 |
| 7,273,647 | B2 * | 9/2007 | Nishikawa | ............... | C30B 29/06 117/928 |
| 7,316,745 | B2 * | 1/2008 | Sadamitsu | ............... | C30B 29/06 117/2 |
| 8,492,193 | B2 * | 7/2013 | Kurita | ................. | H01L 21/3221 257/E31.003 |
| 8,890,291 | B2 | 11/2014 | Ono et al. | | |
| 2001/0004545 | A1 | 6/2001 | Drobny et al. | | |
| 2002/0132452 | A1 * | 9/2002 | Oka | ................... | H01L 21/2022 438/478 |
| 2003/0008435 | A1 * | 1/2003 | Falster | ............... | H01L 21/76243 438/149 |
| 2004/0060917 | A1 | 4/2004 | Liu et al. | | |
| 2005/0048247 | A1 * | 3/2005 | Mule'Stagno | ....... | H01L 21/3225 428/64.1 |
| 2005/0250349 | A1 * | 11/2005 | Sadamitsu | ............... | C30B 29/06 438/800 |
| 2005/0255671 | A1 * | 11/2005 | Falster | ............... | H01L 21/76243 438/455 |
| 2006/0057845 | A1 * | 3/2006 | Koyanagi | .......... | H01L 21/28518 438/682 |
| 2006/0075960 | A1 * | 4/2006 | Borgini | ............... | H01L 21/3225 117/200 |
| 2006/0130736 | A1 * | 6/2006 | Takeno | ............... | H01L 21/3225 117/2 |
| 2006/0213424 | A1 * | 9/2006 | Mueller | ................... | C30B 25/12 117/15 |
| 2007/0169688 | A1 * | 7/2007 | Yoon | ....................... | C30B 29/06 117/94 |
| 2007/0178668 | A1 * | 8/2007 | Nakai | ..................... | C30B 29/06 438/471 |
| 2007/0218570 | A1 * | 9/2007 | Nakamura | ............... | C30B 15/00 438/5 |
| 2007/0252239 | A1 | 11/2007 | Maeda et al. | | |
| 2009/0242843 | A1 | 10/2009 | Ebara | | |
| 2009/0278239 | A1 * | 11/2009 | Shiota | ................. | H01L 21/3225 257/655 |
| 2010/0038757 | A1 * | 2/2010 | Isogai | ..................... | C30B 29/06 257/655 |
| 2010/0163807 | A1 * | 7/2010 | Fukuda | ................... | C30B 15/00 252/500 |
| 2011/0053350 | A1 * | 3/2011 | Watanabe | ............... | C30B 25/20 438/473 |
| 2011/0259259 | A1 * | 10/2011 | Harada | ................. | C30B 15/203 117/13 |
| 2011/0263126 | A1 * | 10/2011 | Harada | ................. | C30B 15/203 438/691 |
| 2012/0043644 | A1 | 2/2012 | Ono et al. | | |

FOREIGN PATENT DOCUMENTS

| | | |
|---|---|---|
| EP | 1 801 863 | 6/2007 |
| EP | 1811066 | 7/2007 |
| JP | 07-161707 | 6/1995 |
| JP | 07-176489 | 7/1995 |
| JP | 08-097222 | 4/1996 |
| JP | 10-098047 | 4/1998 |
| JP | 11-135514 | 5/1999 |
| JP | 11-214322 | 8/1999 |
| JP | 2000-31150 | 1/2000 |
| JP | 2000-169293 | 6/2000 |
| JP | 2001-106594 | 4/2001 |
| JP | 2001-217251 | 8/2001 |
| JP | 2002-110683 | 4/2002 |
| JP | 2003-524874 | 8/2003 |
| JP | 2004-111732 | 4/2004 |
| JP | 2004-221435 | 8/2004 |
| JP | 2007-067338 | 3/2007 |
| JP | 2007-186376 | 7/2007 |
| JP | 2007-305968 | 11/2007 |
| JP | 2008-28355 | 2/2008 |
| JP | 2008-66357 | 3/2008 |
| JP | 2008-098640 | 4/2008 |
| JP | 2008-515200 | 5/2008 |
| JP | 2008-150283 | 7/2008 |
| JP | 2008-294112 | 12/2008 |
| JP | 2009-049256 | 3/2009 |
| KR | 10-2003-0051602 | 6/2003 |
| KR | 10-0588098 | 6/2006 |
| KR | 10-0694237 | 3/2007 |
| WO | 2006/036869 | 4/2006 |
| WO | 2007/100158 | 9/2007 |

OTHER PUBLICATIONS

Korea Office action, dated Mar. 21, 2013 along with an english translation thereof.

Camillo-Castillo R et al., "Application of flash-assist rapid thermal processing subsequent to low-temperature furnace anneals", Journal of Vacuum Science and Technology: Part B, AVS / AIP, Melville, New York, NY, US, vol. 24, No. 1, XP012091315, Jan. 26, 2006, pp. 450-455.

Akatsuka M et al., "Mechanical properties of 300 mm wafers", Microelectronic Engineering, Elsevier Publishers BV., Amsterdam, NL, vol. 56, No. 1-2, XP004234848, May 1, 2001, pp. 99-107.

Search report from E.P.O., mail date is May 28, 2013.

Japan Office action, dated Nov. 5, 2013 along with an English translation thereof.

J.O. Stevenson, "Numerical Methods for Determining Interstitial Oxygen in Silicon," Sandia Report, Feb. 13, 1995, pp. 1-39.

Extended European Search Report for EP Patent Application 14151040.4, which was mailed on Jun. 5, 2014.

Korean Office action for 10-2001-7025002, dated Sep. 26, 2013 along with an English translation thereof.

Japan Office action for JP-2009-098262, dated Oct. 1, 2013 along with an English translation thereof.

Notice of Allowance of JP Patent Application No. JP 2013-055515 mailed Nov. 4, 2014; along with an English Translation thereof.

Summons to attend oral proceedings for EP 10755675.5, mailed on Feb. 13, 2015.

(56) References Cited

OTHER PUBLICATIONS

Japanese Office Action for 2014-055512, mailed Feb. 17, 2015; along with an English translation.
U.S. Office Action for U.S. Appl. No. 13/258,962, mailed Feb. 7, 2013.
US Final Office Action for U.S. Appl. No. 13/258,962, mailed Aug. 6, 2013.
US Advisory Action for U.S. Appl. No. 13/258,962, mailed Jan. 2, 2014.
US Notice of Allowance for U.S. Appl. No. 13/258,962, mailed Jul. 18, 2014.

* cited by examiner

SILICON WAFER AND MANUFACTURING METHOD THEREOF

This application is a Divisional of U.S. patent application Ser. No. 13/258,962 which is a National Stage of International Application No. PCT/JP2010/002117 filed Mar. 25, 2010, which claims priority to Japanese Application No. 2009-098262 filed Apr. 14, 2009, and Japanese Application Nos. 2009-075001, 2009-074837, 2009-074836 all filed Mar. 25, 2009. The disclosures of U.S. patent application Ser. No. 13/258,962 and PCT/JP2010/002117 are expressly incorporated by reference herein in their entireties.

TECHNICAL FIELD

The present invention relates to a silicon wafer and a manufacturing method thereof, and more particularly, to a technique which can be very suitably used to prevent generation of a deformation such as a warp of a silicon wafer, which is provided to a thermal treatment in which a high internal stress is generated.

BACKGROUND ART

A thermal process of device processes includes a plural low-temperature treatments and plural high-temperature treatments. Accordingly, even when an epitaxial wafer is used, oxygen precipitates are formed in a substrate wafer. In the past, the oxygen precipitates were effective for capturing (gettering) metal dopants which may be generated in the process and the formation of the oxygen precipitates was desired.

However, recent device manufacturing processes include a plurality of rapid temperature-rising-and-falling thermal treatment processes and thus a stress load increases in thermal treatment in the device process. Particularly, with the increase in integration of devices, the rapid temperature-rising-and-falling thermal treatment process tends to be further shortened in time and the highest temperature in the rapid temperature-rising-and-falling thermal treatment process tends to be raised. From the 45 nm node (hp 65), annealing processes called FLA (flash lamp annealing), LSA (Laser Spike Anneal), LTP (laser thermal process), and Spike-RTA (Rapid Thermal Annealing) may be used.

In the FLA process among these, a wafer is heated to an initial temperature of 400° C. to 600° C., the entire surface of the wafer is irradiated with light of a short wavelength from an Xe lamp and the like to rapidly heat only the outermost surface layer of the wafer equal to or higher than 1100° C. up to the vicinity of the melting point of silicon, and it is then rapidly cooled. The thermal treatment time is on the order from μ (micro) seconds to milli seconds.

The techniques related to the FLA process are disclosed in Patent Document 1 and Patent Document 2.

CITATION LIST

Patent Document

Patent Document 1: Published Japanese Translation of PCT No. 2008-515200
Patent Document 2: Japanese Unexamined Patent Application, First Publication No. 2008-98640

DISCLOSURE OF INVENTION

Technical Problem

In the FLA process, since a temperature difference of 100° C. is caused between the front surface and the back surface of a wafer, a stress much greater than that in the RTA process which has been previously performed may be loaded. Specifically, a thermal stress greater than 20 MPa may be partially generated.

In the rapid temperature-rising-and-falling thermal treatment process such as the FLA process, when oxygen precipitates are formed, the sizes of the precipitates are deviated and a slip is caused from the large precipitates. Due to this slip, there may be a problem in that a wafer locally warps. When the wafer warps, the misalignment with a base pattern is caused at the time of exposure in the device process, thereby lowering the device yield. It is not possible to restore the shape of the wafer, which locally warps in this way, to the original shape.

On the other hand, in the device process, it is not possible to completely suppress boat scratches and transfer scratches. The dislocation (slip) causing the deformation of a wafer is generated from the boat scratches and the transfer scratches. Such slip extension can be suppressed when the oxygen concentration and boron concentration in the wafer are high.

However, both the increase in oxygen concentration and the increase in boron concentration can promote the formation of oxygen precipitates. Therefore, it is difficult to achieve both the suppression of the slip due to the processes and the suppression of the deformation and warp of the wafer due to the formation of oxygen precipitates.

When oxygen precipitates are formed in the device processes, oxygen in the wafer is consumed and interstitial oxygen is reduced. In this case, it is considered that the extension of the generated dislocation cannot be further suppressed, thereby further lowering the wafer strength. As described in paragraph [0042] of Patent Document 2, the device manufacturing processes have many restrictions to processing conditions such as not performing the thermal treatment at 700° C. or higher in the processes subsequent to the FLA process so as to suppress the diffusion of dopants and the like. Therefore, there is a need for solving the problem with the generation of slip in a silicon wafer before performing the device manufacturing processes.

The invention is made in consideration of the above-mentioned problems. A goal of the invention is to provide a wafer and a manufacturing method thereof, which can reduce the precipitation of oxygen to prevent the wafer deformation from being generated and can prevent the slip extension due to boat scratches and transfer scratches serving as a reason for the decrease in wafer strength, even when the wafer is provided to a rapid temperature-rising-and-falling thermal treatment process.

Another goal of the invention is to provide an epitaxial wafer which does not cause the formation of precipitates in the device processes so as to prevent the local wafer deformation in the device processes and which has excellent slip resistance and a manufacturing method thereof.

Still another goal of the invention is to provide a silicon wafer which does not cause the formation of oxygen precipitates in the wafer edge portion in the device processes so as to prevent the local wafer deformation in the device processes and which has excellent slip resistance and a manufacturing method thereof.

Still another goal of the invention is to provide a silicon wafer which hardly causes the formation of oxygen precipitates in bulk in spite of performing a DZ annealing process at a high temperature, which suppresses the formation of oxygen precipitates in the device processes so as to prevent the local wafer deformation in the device processes, which does not cause the formation of oxygen precipitates in the device processes, and which has excellent slip resistance, and a manufacturing method thereof.

Still another goal of the invention is to provide a silicon wafer which does not cause the formation of oxygen precipitates in the outer peripheral edge of the wafer in the device processes so as to prevent the local wafer deformation in the outer peripheral edge of the wafer in the device processes and which has excellent slip resistance, and a manufacturing method thereof.

Solution to Problem

In the rapid temperature-rising-and-falling thermal treatment process such as the FLA process and Spike-RTA process, since the treatment temperature (the peak temperature) is higher and the rising and falling of temperature are performed for a very short time, the stress acting on the wafer increases, thereby causing a deformation such as a wafer warp due to the slip extending at the time of precipitating oxygen. Accordingly, the inventor et al. studied means for providing a wafer which can endure the rapid temperature-rising-and-falling thermal treatment process. First, it could be seen that the prevention of the slip extension using the oxygen precipitates in a wafer, which has been employed as the means for preventing the wafer deformation at the time of performing plain thermal treatment with the same conditions as in the past is not effective. This is because the temperature condition of the rapid temperature-rising-and-falling thermal treatment process is excessively severe and strict and thus conversely the oxygen precipitates cause slip extension, thereby causing wafer deformation. In the FLA process and the Spike-RTA process, since stress states in wafers are different depending on the types of the wafers provided to the thermal treatment, it could be seen that countermeasures against the deformation depending on the types of the wafers are necessary.

An example of the rapid temperature-rising-and-falling thermal treatment process is a MOS FET annealing process with 45 nm node (hp 65). Here, the annealing process is performed at a higher temperature for a shorter time than those in the past RTA process. As shown in FIG. 3, in the MOS FET indicated by reference sign Mos, ultra-shallow junctions Mex which are dopant-diffused regions of which the depth (junction depth) Xi from the substrate surface is about 20 nm are formed adjacent to a source Ms and a drain Md. In the ultra-shallow junction Mex, since the box-like dopant profile shown in FIG. 4, that is, the uniformity in dopant concentration in the region of the ultra-shallow junction Mex and the steep variation at the boundary should be realized, the rapid temperature-rising-and-falling thermal treatment process is performed. By performing the rapid temperature-rising-and-falling thermal treatment process, the dopants can be sufficiently activated by a high heating temperature to lower the resistance and the dopants can be prevented from unnecessarily diffusing by a short heating time, and the deactivation of the activated dopants can also be suppressed.

In this way, in order to realize the junction depth Xi less than 20 nm required for the 45 nm node (hp 65), the FLA process or the LSA process is performed. In the FLA process, a wafer is heated to an initial temperature of 400° C. to 600° C., the entire surface of the wafer is irradiated with light of a short wavelength from an Xe flash lamp and the like to rapidly heat only the outermost surface layer of the wafer up to 900° C. to 1350° C. for a heating time of the millisecond time scale, and it is then rapidly cooled. In the LSA process, a wafer is heated to the initial temperature of 400° C. to 600° C. on a hot plate, the wafer is spot-scanned with a continuous wave laser to rapidly heat the wafer equal to or higher than 1100° C. up to the vicinity of the melting point of silicon so that the heating time is changed from the microsecond time scale to the millisecond time scale, and it is then rapidly cooled. In the FLA process and the LSA process, treatment conditions are selected which can realize the retention of the dopant concentration distribution characteristic of the ultra-shallow junction region indicated by Mex in FIG. 3, the decrease of junction leakage, the suppression of gate leakage, the decrease of parasitic resistance of source and drain, and the suppression of gate depletion.

In the FLA process performed under the above-mentioned conditions, the internal stress generated in the wafer at the time of thermal treatment may reach a level of 50 to 150 MPa. The rapid temperature-rising-and-falling thermal treatment process in the invention is not limited to the FLA process, but may include all the severe thermal treatments under the condition that the generated internal stress is greater than 20 MPa.

In the FLA process or the Spike-RTA as the rapid temperature-rising-and-falling thermal treatment process, since the temperature is higher and the temperature-rising rate and the temperature-falling rate are high, a large thermal stress is caused as described above. The slip dislocation is caused from large oxygen precipitates due to the large thermal stress.

As a result, the overlay error, that is, the misalignment between patterns in photolithography processes performed before and after the rapid temperature-rising-and-falling thermal treatment process in manufacturing devices, is caused.

For example, as can be seen from the manufacturing of ICs or LSIs, when a silicon wafer is exposed to a pattern, a wafer 21 is supported and fixed onto a work stage 22 by vacuum suction, a photomask 23 is supported and fixed onto a mask holder 24 above the work stage 22, the work stage 22 is lifted up to bring the thin wafer 21 into close contact with the photomask 23, and then the wafer is exposed, as shown in FIG. 5. A photoresist film (not shown) is formed on the surface of the wafer 21 in advance and the photoresist film is exposed to bake a pattern of the photomask 23.

In FIG. 6, variations in the horizontal direction generated when a pattern to be formed in a post-process of the rapid temperature-rising-and-falling thermal treatment process is superimposed on the pattern formed on the wafer in the pre-process of the rapid temperature-rising-and-falling thermal treatment process are indicated by arrow lengths at the points on the wafer. The wafer is vacuum-suctioned onto the stage at the time of exposure, but when the suctioned wafer has a deformation such as a warp, the wafer is fixed to the stage in a state where the deformation such as a warp is corrected at the time of suctioning. Accordingly, it is thought that the pattern formed on the wafer in the pre-process is deformed (horizontally shifts) by the corrected deformation of the wafer and departs from the original position to cause the overlay error.

It is thought that the deformation such as a warp of the wafer results from the slip dislocation generated from large precipitates. When a shift greater than a predetermined amount is caused due to the deformation such as a warp, this variation cannot be corrected and thus the corresponding wafer is discarded. That is, the device yield is markedly lowered due to the deformation of the wafer and the device manufacturing cost is greatly raised as a whole.

With the inventors' knowledge, the overlay error can be almost predicted on the basis of the density of BMDs (oxygen precipitates) generated. As shown in FIG. 7, when the BMD density is greater than $5 \times 10^4$ pcs/cm$^2$, the deformation is rapidly generated and the maximum shift becomes greater than 10 nm which is the permissible level. It is thought that the increase of the maximum shift shown in the drawing is attributed to the increase of the magnitude of slip generated.

In the past, the gettering performance was given to the wafer by oxygen precipitates, but the frequency where the gettering is actually necessary, that is, the frequency where the heavy-metal pollution occurs, is very small in the present device manufacturing processes. This is because the cleanliness (the ratio at which foreign particles are not present) of a wafer with a diameter of 300 mm or the cleanliness of a wafer with a diameter of 450 mm is much higher than the cleanliness of fabrication lines mainly using wafers with a diameter of 200 mm and requiring the gettering and environments in which the lines are installed. Accordingly, the countermeasure against the overlay error having a direct influence on the device yield can be selected rather than the gettering which is a countermeasure against contaminations of heavy-metal having low incidence. Therefore, the inventor et al. selected the reduction of BMDs.

In the FLA process or the spike-RTA process as the rapid temperature-rising-and-falling thermal treatment process, the thermal treatment is performed in a state where a ring-like susceptor comes in contact with only the edge of a wafer to support the wafer. Accordingly, when it is observed in the direction of <4,0,0> by X-ray topography using reflected light, slip dislocation is generated at the edge of the wafer supported as shown in FIG. 8.

When this slip dislocation is generated only in the vicinity of the supported portion, that is, the edge of the wafer and is located within about 3 mm from the edge so as not to reach a device area, it is thought that the slip dislocation does not have an influence on the device area. However, as a result, scratches in the wafer may be generated from the slip to lower the wafer strength, thereby causing the decrease in the device yield. In the past, the slip extension could be suppressed by the use of the oxygen precipitates. However, when the oxygen precipitates contributing to the suppression of the slip extension are present in a wafer, the oxygen precipitates cause the overlay error due to the wafer deformation in the rapid temperature-rising-and-falling thermal treatment process. Accordingly, it is preferable that other countermeasures be considered.

Specifically, before a wafer is provided to a device process causing a large stress, the oxygen concentration at the time of pulling an ingot, the concentration of dopants to be added at the time of pulling, and the conditions of the RTA process for dissolving precipitation nuclei are set so as to suppress the precipitation of oxygen in the wafer. The inventor et al. found that the slip serving as a reason for the deformation generated in the wafer in the rapid temperature-rising-and-falling thermal treatment process can be suppressed by properly setting the conditions. The inventor et al. found that the slip extension resulting from boat scratches and transfer scratches, which cause a problem in processes other than the rapid temperature-rising-and-falling thermal treatment process, can be prevented by properly setting the conditions as in examples to be described later.

<First Aspect>

(A1) A first aspect of the invention provides a method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: an epitaxial process of causing an epitaxial layer to grow on the surface of a substrate, which is doped with boron so as to have resistivity of 0.02 Ωcm to 1 kΩcm and of which the initial oxygen concentration Oi is in the range of $14.0 \times 10^{17}$ to $22 \times 10^{17}$ atoms/cm$^3$ (Old-ASTM); and a precipitation, dissolution, and thermal treatment process of treating a wafer in the treatment temperature range of 1150° C. to 1300° C., the retention time range of 5 sec to 1 min, and the temperature-falling rate range of 10° C./sec to 0.1° C./sec, wherein the precipitation, dissolution, and thermal treatment process is performed before or after the epitaxial process.

(A2) The first aspect of the invention also provides a method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: an epitaxial process of causing an epitaxial layer to grow on the surface of a substrate, which is doped with nitrogen of $1 \times 10^{13}$ to $5 \times 10^{14}$ atoms/cm$^3$; and a precipitation, dissolution, and thermal treatment process of treating a wafer in the treatment temperature range of 1200° C. to 1300° C., the retention time range of 5 sec to 1 min, and the temperature-falling rate range of 10° C./sec to 0.1° C./sec after the epitaxial process.

(A3) The first aspect of the invention also provides a method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: an epitaxial process of causing an epitaxial layer to grow on the surface of a substrate, which is doped with boron so as to have resistivity of 0.020 Ωcm to 0.001 Ωcm and of which the initial oxygen concentration Oi is in the range of $11.0 \times 10^{17}$ to $3 \times 10^{17}$ atoms/cm$^3$ (Old-ASTM).

(A4) The first aspect of the invention also provides a method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: an epitaxial process of causing an epitaxial layer to grow on the surface of a substrate, which is doped with boron so as to have resistivity of 0.02 Ωcm to 0.001 Ωcm and of which the initial oxygen concentration Oi is in the range of $11.0 \times 10^{17}$ to $18 \times 10^{17}$ atoms/cm$^3$ (Old-ASTM); and a precipitation, dissolution, and thermal treatment process of treating a wafer in the treatment temperature range of 1150° C. to 1300° C., the retention time range of 5 sec to 1 min, and the temperature-falling rate range of 10° C./sec to 0.1° C./sec before the epitaxial process.

(A5) In the method of manufacturing a silicon epitaxial wafer described in any one of (A1) to (A4), the treatment atmosphere in the precipitation, dissolution, and thermal treatment process may be set to an atmosphere of non-oxidizing gas not containing nitrogen.

(A6) In the method of manufacturing a silicon epitaxial wafer described in any one of (A1) to (A4), the treatment atmosphere in the precipitation, dissolution, and thermal treatment process may be set to a mixed atmosphere of non-oxidizing gas not containing 1% or more of nitrogen and oxygen gas.

(A7) In the method of manufacturing a silicon epitaxial wafer described in any one of (A1) to (A4), the treatment atmosphere in the precipitation, dissolution, and thermal treatment process may be set to a mixed atmosphere of non-oxidizing gas not containing 3% or more of nitrogen and oxygen gas, and the temperature falling rate may be set to be in the range from 50° C./sec to 20° C./sec.

(A8) A silicon epitaxial wafer according to the invention may be manufactured by the method of manufacturing a silicon epitaxial wafer described in any one of (A1) to (A7).
(RTA Process on High-Oxygen p-Wafer Before or after Epi)

The method of manufacturing a silicon epitaxial wafer according to the first aspect of the invention is a method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: an epitaxial process of causing an epitaxial layer to grow on the surface of a substrate, which is doped with boron so as to have resistivity of 0.02 Ωcm to 1 kΩcm and of which the initial oxygen concentration Oi is in the range of $14.0 \times 0^{17}$ to $22 \times 10^{17}$ atoms/cm$^3$ (Old-ASTM); and a precipitation, dissolution, and thermal treatment process of treating a wafer in the treatment temperature range of 1150° C. to 1300° C., the retention time range of 5 sec to 1 min, and the temperature-falling rate range of 10° C./sec to 0.1° C./sec before or after the epitaxial process.

In the method of manufacturing an epitaxial silicon wafer according to the first aspect of the invention, in a p-wafer in which a high oxygen concentration is set and a boron concentration having a slip extension suppressing effect is set to be relatively low by the setting at the time of pulling a single crystal silicon, oxygen precipitation nuclei causing a wafer deformation can be dissolved through the use of the precipitation, dissolution, and thermal treatment process. Accordingly, even when a silicon wafer obtained by the use of the manufacturing method according to the first aspect of the invention is provided to the rapid temperature-rising-and-falling thermal treatment process of the device manufacturing processes of which the conditions are more severe than those in the past RTA process and are severe conditions in which the highest temperature is in the range of 1050° C. to the melting point of silicon, the temperature rising and falling rate is in the range of 150° C./sec to 10000° C./sec, preferably in the range of 500° C./sec to 3000° C./sec, and more preferably in the range of 1000° C./sec to 2000° C./sec, and the maximum stress generated in the silicon wafer is greater than 20 Mpa, it is possible to prevent deformation of the wafer. In the manufacturing method according to the first aspect of the invention, it is also possible to provide a silicon wafer which can prevent slip extension resulting from boat scratches and transfer scratches causing the lowering of the wafer strength.

The inventor et al. found a countermeasure which can achieve both the prevention of generation of wafer deformation and the prevention of generation of a slip in the silicon wafer manufacturing process.

In the first aspect of the invention, the treatment temperature in the epitaxial process has only to be lower than the treatment temperature in the precipitation, dissolution, and thermal treatment process and can be set to a general condition (for example, equal to or higher than 1000° C. and equal to or lower than 1100° C.). The temperature-falling rate means a cooling rate at least in the range of the highest temperature (for example, equal to or higher than 1050° C. and equal to or lower than 1400° C.) to 700° C., which is a range greatly contributing to dissolution the precipitates. The concentrations of dopants of boron in the epitaxial layer are set on the basis of the device standard to be formed but have a small contribution to the slip or deformation in the invention. Accordingly, an epitaxial layer having any dopant concentration can be employed.

(N-Doped Version High-Temperature RTA)

According to the first aspect of the invention, the method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes: an epitaxial process of causing an epitaxial layer to grow on the surface of a substrate, which is doped with nitrogen of $1 \times 10^{13}$ to $5 \times 10^{14}$ atoms/cm$^3$; and a precipitation, dissolution, and thermal treatment process of treating a wafer in the treatment temperature range of 1200° C. to 1300° C., the retention time range of 5 sec to 1 min, and the temperature-falling rate range of 10° C./sec to 0.1° C./sec after the epitaxial process. In the method of manufacturing a silicon epitaxial wafer according to the first aspect of the invention, it is possible to achieve both the prevention of generation of wafer deformation and the prevention of generation of a slip in the p-wafer which is doped with nitrogen and in which oxygen precipitates can be easily formed.

(Low-Oxygen p/p+, p/p++ Wafer)

According to the first aspect of the invention, the method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes an epitaxial process of causing an epitaxial layer to grow on the surface of a substrate, which is doped with boron so as to have resistivity of 0.02 Ωcm to 0.001 Ωcm and of which the initial oxygen concentration Oi is in the range of $11.0 \times 10^{17}$ to $3 \times 10^{17}$ atoms/cm$^3$ (Old-ASTM). In the method of manufacturing a silicon epitaxial wafer according to the first aspect of the invention, it is possible to achieve both the prevention of generation of wafer deformation and the prevention of generation of a slip in the silicon wafer manufacturing process even in a p+ wafer or a p++ wafer in which a low oxygen concentration is set by the setting at the time of pulling and the boron concentration having the slip extension suppressing effect is relative high.

In the first aspect of the invention, when the oxygen concentration of the silicon single crystal is set to the above-mentioned range of oxygen concentration of the silicon wafer at the time of pulling a silicon single crystal (silicon ingot), from which silicon wafers are obtained by slicing, by a CZ (Czochralski) method, it can be coped with through the use of the application of a magnetic field to a silicon melt, the crucible and crystal rotation control, and the like. However, when a normal CZ method is used, it may be difficult to set the interstitial oxygen concentration to $4 \times 10^{17}$ atoms/cm$^3$ or less. Therefore, in the case of a low oxygen concentration, the interstitial oxygen concentration can be set to $4 \times 10^{17}$ atoms/cm$^3$ or less by the use of an MCZ method (Magnetic CZ method) of applying a magnetic field to the silicon melt to pull a single crystal. By setting the rotations of a quartz crucible and a pulled single crystal to a low speed, it is also possible to lower the interstitial oxygen concentration.

Actually, when the number of rotations of the quartz crucible is R1 (rpm) and the number of rotations of the crystal is R2 (rpm), R1 and R2 can be set within the range of 0.1 to 2 and the range of 1 to 7, respectively, so as to satisfy the following conditions.

That is, R2<7−5(R1−0.5) is satisfied when R1 is in the range of 0.5 to 0.7, R2<6 is satisfied when R1 is in the range of 0.7 to 1, and R2<6−4(R1−1) is satisfied when R1 is in the range of 1 to 2.

In this case, the interstitial oxygen concentration in the single crystal can be set to $4\times10^{17}$ atoms/cm$^3$ or less and the silicon single crystal with a low oxygen concentration can be pulled.

The number of rotations R1 (rpm) of the silica quartz and the number of rotations R2 (rpm) of the crystal can be set within the range of 0.1 to 2 and the range of 1 to 7, respectively, so as to satisfy the following conditions.

That is, R2<7−5(R1−0.3) is satisfied when R1 is in the range of 0.3 to 0.5, R2<6 is satisfied when R1 is in the range of 0.5 to 0.7, and R2<6−3.4(R1−0.7) is satisfied when R1 is in the range of 0.7 to 1.

In this case, the interstitial oxygen concentration in the single crystal can be set to $3.5\times10^{17}$ atoms/cm$^3$ or less and a silicon single crystal with a low oxygen concentration can be provided.

In the first aspect of the invention, a horizontal magnetic field or a cusp magnetic field may be employed as the magnetic field to be applied to the silicon melt. For example, the intensity of the horizontal magnetic field can be set to the range of 3000 to 5000 G (0.3 T to 0.5 T). When the intensity of the magnetic field is less than the range, the convection suppression effect in the silicon melt is not sufficient, the shape of a solid-liquid interface cannot be set to a desirable shape, and the oxygen concentration cannot be sufficiently lowered, which is not preferable. When the intensity of the magnetic field is greater than the range, the convection is excessively suppressed, the high-temperature silicon melt deteriorates the inner surface of the quartz crucible, and thus the dislocation-free rate of the crystal is lowered, which is not preferable.

In the invention, the relationship between the central position of the magnetic field and the position of the melt surface at the time of pulling the crystal is preferably set to the range of −75 mm to +50 mm and more preferably to the range of −20 mm to +45 mm. Here, the central position of the horizontal magnetic field means a height position at which the center of a magnetic field generating coil is located. −75 mm means that the central position of the magnetic field is located 75 mm down from the melt level. +50 mm means that the central position of the magnetic field is located 50 mm up from the melt level.

By using the CZ method or the MCZ method to pull a crystal, it is possible to suppress the convection of the silicon melt, to reduce the amount of quartz crucible melted, to reduce the dopant concentration in the quartz crucible by using a synthetic quartz crucible, thereby growing a CZ crystal with a quality closer to an FZ crystal.

Here, the synthetic quartz crucible means that at least the inner surface coming in contact with the raw melt is formed of the following synthetic quartz.

The synthetic quartz is a raw material which is chemically synthesized and produced and the synthetic fused silica powder is amorphous. The raw material of the synthetic quartz is gaseous or liquid and thus can be easily refined. The purity of the synthetic silica powder can be made to be higher than that of a natural quartz powder. Examples of the raw material of the synthetic fused silica include a gaseous material such as carbon tetrachloride and a liquid material such as silicon alkoxide. In the synthetic fused silica powder, all dopants can be set to 0.1 ppm or less.

The glass acquired by melting the synthetic fused silica powder transmits ultraviolet rays of a wavelength of 200 nm or less well, as the result of measuring the optical transmittance. That is, it is thought that the glass has a characteristic close to the synthetic fused silica acquired using carbon tetrachloride used for ultraviolet optics as a raw material.

When the fluorescence spectrum acquired by exciting the glass, which is acquired by melting the synthetic fused silica powder, with an ultraviolet ray of a wavelength of 245 nm is measured, the fluorescence peak like the melt of a natural quartz powder is not seen.

By measuring the dopant concentration, the amount of silanol, the optical transmittance, or the fluorescence spectrum acquired by exciting it with an ultraviolet ray of a wavelength of 245 nm, it can be determined whether the quartz material is natural quartz or synthetic quartz.

In the first aspect of the invention, in order to control a gas flow state of the surface of the silicon melt, it is required that the furnace pressure is equal to or higher than 10 Torr (1.3 kPa), preferably in the range of 30 Torr to 200 Torr (4.0 to 27 kPa), and more preferably in the range of 30 Torr to 70 Torr (4.0 to 9.3 kPa). When the furnace pressure is raised, the gas flow rate of an inert gas such as Ar on the melt is lowered and the reactant gas such as SiO vaporized from the melt is not exhausted well, and thus the oxygen concentration in the crystal is raised. SiO is not exhausted but agglomerates in a portion of the melt surface in the furnace with a temperature of about 1100° C. or lower, thereby generating dust. This dust is dropped to the melt, thereby causing the crystal dislocation. As the upper limit of the furnace pressure, the above-mentioned upper limit is defined to prevent this problem.

In the first aspect of the invention, by setting the flow rate of the atmosphere gas supplied to the CZ furnace to the range of 100 to 200 L/min and setting the pressure of the CZ furnace to 6700 pa or less, it is possible to effectively exhaust SiO vaporized from the surface of the melt to the outside of the equipment and to drive particles floating on the surface of the melt to the wall of the crucible, thereby preventing the oxygen concentration in the crystal from being increased.

(Before Epi and after RTA Process on High-Oxygen p+, p++ Wafer)

According to the first aspect of the invention, the method of manufacturing a silicon epitaxial wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes: an epitaxial process of causing an epitaxial layer to grow on the surface of a substrate, which is doped with boron so as to have resistivity of 0.02 Ωcm to 0.001 Ωcm and of which the initial oxygen concentration Oi is $11.0\times10^{17}$ to $18\times10^{17}$ atoms/cm$^3$ (Old-ASTM); and a precipitation, dissolution, and thermal treatment process of treating a wafer in the treatment temperature range of 1150° C. to 1300° C., the retention time range of 5 sec to 1 min, and the temperature-falling rate range of 10° C./sec to 0.1° C./sec before the epitaxial process. In the method of manufacturing a silicon epitaxial wafer according to the first aspect of the invention, it is possible to achieve both the prevention of generation of wafer deformation and the prevention of generation of a slip even in a p+ wafer or a p++ wafer in which a high oxygen concentration is set by the setting at the time of pulling and the boron concentration having the oxygen precipitation increasing effect is relative high.

In the precipitation, dissolution, and thermal treatment process in the first aspect of the invention, the treatment atmosphere is set to any one of the atmosphere of non-oxidizing gas not containing nitrogen, the mixed atmosphere of non-oxidizing gas not containing nitrogen and oxygen gas of 1% or more, and the mixed atmosphere of non-oxidizing gas not containing nitrogen and oxygen gas of 3% or more and the temperature falling rate is set to be in the range of 50° C./sec to 20° C./sec. In this way, by performing the process in the atmosphere not containing nitrogen which is vacancy-injection gas, it is possible to achieve both the prevention of generation of wafer deformation and the prevention of generation of a slip. In addition, when the oxygen concentration is relative high, it is possible to achieve both the prevention of generation of wafer deformation and the prevention of generation of a slip, by setting the temperature-falling rate to be higher. In the mixed atmosphere, the upper limit of the oxygen gas concentration is set to 10%.

The silicon epitaxial wafer according to the first aspect of the invention is manufactured by the use of the above-mentioned methods of manufacturing a silicon epitaxial wafer. Accordingly, it is possible to achieve both the prevention of generation of the deformation such as a warp of the wafer, which causes the overlay error shown in FIG. 6, and the prevention of generation of the slip dislocation in the edge of the wafer, which is supported as shown in FIG. 5.

<Second Aspect>

(B1) A second aspect of the invention provides a method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: a silicon single crystal pulling process of pulling a straight body portion of a silicon single crystal as a defect-free region not having grown-in defects using the Czochralski method; a mirror treatment process of mirror finishing a sliced wafer; and a precipitation, dissolution, and thermal treatment process of treating a wafer in the atmosphere of non-oxidizing gas not containing nitrogen in the treatment temperature range of 950° C. to 1200° C., with a retention time range of 5 sec to 1 min, and with a temperature-falling rate range of 10° C./sec to 0.1° C./sec, wherein the precipitation, dissolution, and thermal treatment process is performed before or after the mirror treatment process.

(B2) The second aspect of the invention also provides a method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: a silicon single crystal pulling process of pulling a straight body portion of a silicon single crystal using the Czochralski method so as to include a defect-free region not having grown-in defects and an OSF region; a mirror treatment process of mirror finishing a sliced wafer; and a precipitation, dissolution, and thermal treatment process of treating a wafer in the atmosphere of non-oxidizing gas not containing nitrogen in the treatment temperature range of 1225° C. to 1350° C., the retention time range of 5 sec to 1 min, and the temperature-falling rate range of 10° C./sec to 0.1° C./sec, wherein the precipitation, dissolution, and thermal treatment process is performed before or after the mirror treatment process.

(B3) In the method of manufacturing a silicon wafer according to the second aspect of the invention described in (B1) or (B2), the treatment atmosphere in the precipitation, dissolution, and thermal treatment process may be set to a mixed atmosphere of non-oxidizing gas not containing nitrogen and oxygen gas of 3% or more.

(B4) In the method of manufacturing a silicon wafer according to the second aspect of the invention described in any one of (B1) to (B3), the initial oxygen concentration Oi in the silicon single crystal pulling process may be set to be in the range of $12.0 \times 10^{17}$ to $20 \times 10^{17}$ atoms/cm$^3$ (Old-ASTM).

(B5) A silicon wafer according to the second aspect of the invention is manufactured using the method of manufacturing a silicon wafer described in any one of (B1) to (B4)

The method of manufacturing a silicon wafer according to the second aspect of the invention is a method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: a silicon single crystal pulling process of pulling a straight body portion of a silicon single crystal as a defect-free region not having grown-in defects using the Czochralski method; a mirror treatment process of mirror finishing a sliced wafer; and a precipitation, dissolution, and thermal treatment process of treating a wafer in the atmosphere of non-oxidizing gas not containing nitrogen in the treatment temperature range of 950° C. to 1200° C., the retention time range of 5 sec to 1 min, and the temperature-falling rate range of 10° C./sec to 0.1° C./sec, wherein the precipitation, dissolution, and thermal treatment process is performed before or after the mirror treatment process.

In the method of manufacturing a silicon wafer according to the second aspect of the invention, the grown-in defects are free at the time of pulling a silicon single crystal and the oxygen precipitation nuclei causing a wafer deformation is dissolved through the use of the precipitation, dissolution, and thermal treatment process. Accordingly, even when the silicon wafer is provided to the rapid temperature-rising-and-falling thermal treatment process of the device manufacturing processes of which the conditions are more severe than those in the past RTA process and are severe conditions in which the highest temperature is in the range of 1050° C. to the melting point of silicon, the temperature rising and falling rate is in the range of 150° C./sec to 10000° C./sec, preferably in the range of 500° C./sec to 3000° C./sec, and more preferably in the range of 1000° C./sec to 2000° C./sec, and the maximum stress generated in the silicon wafer is greater than 20 Mpa, it is possible to prevent deformation of the wafer. It is also possible to provide a silicon wafer which can prevent slip extension resulting from boat scratches and transfer scratches causing the lowering of the wafer strength.

The inventor et al. found conditions to be set at the time of pulling a single crystal using the Czochralski method as a countermeasure which can achieve both the prevention of generation of wafer deformation and the prevention of generation of a slip in the silicon wafer manufacturing process.

In the method of manufacturing a silicon wafer according to the second aspect of the invention, a silicon single crystal is pulled at a pulling speed at which a silicon single crystal with grown-in defects free can be pulled at the time of pulling the silicon single crystal using the Czochralski method.

The "grown-in defects are free" in the invention means that all defects which may be generated at the time of pulling a crystal, such as COP defects or dislocation clusters, are excluded. It can exclude the OSF region and can include the Pv region and Pi region.

The OSF region can be actualized by the following method. First, a wafer is heated from 900° C. to 1000° C. at a temperature-rising rate of 5° C./min in a dry oxygen atmosphere and is then held in the dry oxygen atmosphere at 1000° C. for 1 hour. Thereafter, the wafer is heated from 1000° C. to 1150° C. at the temperature-rising rate of 3° C./min in the wet oxygen atmosphere and is held in the wet oxygen atmosphere at 1150° C. for 2 hours. Thereafter, the thermal treatment lowering the temperature to 900° C. is performed and the Wright etching of 2 μm is performed to actualize the OSF region. The OSF region means a region in which the OSF density is equal to or more than 10 pcs/cm$^2$, as the measurement result of the wafer in-plane OSF density distribution of the actualized OSF region. When the OSF region is actualized as described above and the region in which the OSF density is equal to or more than 10 pcs/cm$^2$ is not present at the measurement result of the wafer in-plane density distribution of the actualized OSF region, it is determined that the OSF region is not present, that is, the OSF region can be excluded.

When a silicon single crystal ingot is pulled by the Czochralski method, the region in which interstitial silicon type point defects are dominantly present in the ingot is defined as an I region, the region in which vacancy type point defects are dominantly present is defined as a V region, and the region in which agglomerates of the interstitial silicon type point defects and agglomerates of the vacancy type point defects are not present is defined as a P region. At this time, the region which is adjacent to the I region, which belongs to the P region, and of which the interstitial silicon concentration is less than the least interstitial silicon concentration causing an interstitial dislocation is defined as a Pi region. The region which is adjacent to the OSF region, which belongs to the P region, and of which the vacancy concentration is equal to or less than the vacancy concentration causing the COP defects is defined as a Pv region.

The silicon wafer is manufactured by pulling an ingot from the silicon melt in the pulling furnace at a predetermined pulling speed profile based on the Voronkov theory by the use of the CZ method and cutting the ingot. In general, when the silicon single crystal ingot is pulled from the silicon melt in the furnace using the CZ method, point defects and agglomerates (three-dimensional defects) of the point defects are generated as defects in the silicon single crystal. The point defects can be generally classified into two types of vacancy type point defects and interstitial silicon type point defects. The vacancy means a space formed by causing a silicon atom to depart from a normal position in a silicon crystal lattice. The defects based on the vacancy are the vacancy type point defects. On the other hand, a silicon atom located at a position (interstitial site) other than the lattice points of a silicon crystal is called interstitial silicon.

The point defects are generally formed in the contact surface between the silicon melt (molten silicon) and the ingot (solid silicon). However, by continuously pulling the ingot, the portion which was the contact surface starts its cooling at the same time as the pulling. While the portion is cooled, the vacancies or the interstitial silicon atoms diffuse and the COP defects which are vacancy agglomerates and the dislocation clusters which are interstitial agglomerates are formed. In other words, the agglomerates have a three-dimensional structured based on the agglomeration of the point defects. The agglomerates of the vacancy type point defects include defects called LSTD (Laser Scattering Tomograph Defects) or FPD (Flow Pattern Defects) in addition to the COP defects. The agglomerates of the interstitial silicon type point defects include defects called the LD. The FPD is a trace source indicating a singular flow pattern which appears when a silicon wafer manufactured by cutting an ingot is subjected to Secco etching (etching using a mixed solution of HF:K$_2$Cr$_2$O$_7$ (0.15 mol/L)=2:1) for 30 minutes. The LSTD is a source generating scattered light with a refractive index different from that of silicon when the silicon single crystal is irradiated with infrared rays.

In the Voronkov theory, when the ingot pulling speed is V (mm/min) and the temperature gradient in the vertical direction of the ingot in the vicinity of the interface of the ingot and the silicon melt is G (° C./mm), V/G (mm$^2$/min° C.) is controlled so as to cause a high-purity ingot to grow with a smaller number of defects.

As the value of V/G varies from a high value to a low value, the V region, the OSF region, the Pv region, the Pi region, and the I region are sequentially formed in the ingot.

The value of V/G defining the boundaries of the regions decreases in the order of a threshold value defining the boundary between the V region and the OSF region, a threshold value defining the boundary between the OSF region and the Pv region, a threshold value defining the boundary between the Pv region and the Pi region, and a threshold value defining the boundary between the Pi region and the I region.

The value of V/G varies depending on actual equipment such as the structure of a hot zone in the upper part of the pulling furnace, but can be distinguished by measuring the COP density, the OSF density, the BMD density, the LSTD or FPD density, the Wright etching defect density, and the like.

The "Wright etching defects" are defects detected by the following method. First, an As-grown silicon single crystal wafer is immersed in an aqueous solution of copper sulfate, is then naturally dried, and is subjected to the thermal treatment in the nitrogen atmosphere at 900° C. for about 20 minutes and the Cu decoration. Thereafter, in order to remove a Cu silicide layer on the sample surface layer, the resultant is immersed in a HF/HNO$_3$ mixture solution and the surface layer is removed by several micrometers by etching. Thereafter, the wafer surface is etched by 2 μm by the Wright etching (the chromic acid etching) and the Wright etching defects are detected by the use of an optical microscope. According to this evaluation method, by performing the Cu decoration on the dislocation clusters formed at the time of pulling the crystal, the dislocation clusters can be actualized and can be detected with high sensitivity. That is, the Wright etching defects include the dislocation clusters.

The "LSD density" is a density of defects with a size of 0.1 μm or larger which are detected by the use of a laser scattering particle counter (SP1 (surfscan SP1) which is a product made by KLA-Tencor Corporation).

A silicon single crystal pulled by the following method is used in the silicon wafer according to the second aspect of the invention. That is, at the time of pulling a silicon single crystal by the use of the Czochralski method, a hydrogen-containing material having a partial pressure in terms of hydrogen gas in the range of 40 Pa to 400 Pa is introduced into the atmosphere gas in the CZ furnace and the silicon single crystal pulling speed is set to a speed at which a silicon single crystal with grown-in defects free can be pulled. The atmosphere containing only the inert gas and not containing hydrogen gas may be employed.

The hydrogen-containing material is a material containing a hydrogen atom in its molecule and is a gaseous material which is thermally decomposed to generate hydrogen gas when it is melted in the silicon melt. The hydrogen-containing material includes hydrogen gas itself. By mixing the hydrogen-containing material into the inert gas and introducing the mixed gas into the atmosphere at the time of forming a necking part, it is possible to enhance the hydrogen concentration in the silicon melt. Specific examples of the hydrogen-containing material include inorganic compounds such as hydrogen gas, $H_2O$, and HCl containing a hydrogen atom, hydrocarbon such as silane gas, $CH_4$, and $C_2H_2$, and organic compounds such as alcohol and carboxylic acid containing a hydrogen atom. The hydrogen gas is particularly preferably used. Cheap Ar gas can be preferably used as the atmosphere gas in the CZ furnace, and single substances of various rare gas such as He, Ne, Kr, and Xe or mixed gas thereof can be also used.

The concentration of the hydrogen-containing material in the hydrogen-containing atmosphere is set to be in the range of 40 Pa to 400 Pa as a partial pressure in terms of hydrogen gas. Here, the partial pressure in terms of hydrogen gas is used because the amount of hydrogen atoms that can be obtained by thermally decomposing the hydrogen-containing material depends on the amount of hydrogen atoms originally contained in the hydrogen-containing material. For example, 1 mol of $H_2$ is contained in 1 mol of $H_2O$ but only 0.5 mol of $H_2$ is contained in 1 mol of HCl. Accordingly, in the invention, by using the hydrogen-gas atmosphere in which hydrogen gas is introduced into the inert gas with a partial pressure of 40 to 400 Pa as a reference atmosphere, the concentration of the hydrogen-containing material is preferably determined to obtain the atmosphere equivalent to the reference atmosphere. The preference pressure of the hydrogen-containing material is defined as the partial pressure in terms of hydrogen gas.

That is, assumed that the hydrogen-containing material is melted in the silicon melt and is changed to hydrogen atoms by the thermal decomposition in the high-temperature silicon melt, the amount of hydrogen-containing material to be added can be adjusted so that the partial pressure in terms of hydrogen gas in the changed atmosphere is in the range of 40 to 400 Pa.

In the method of manufacturing a silicon single crystal wafer according to the second aspect of the invention, the allowable range of the speed at which the silicon single crystal with grown-in defects free can be pulled can be widened by introducing the hydrogen-containing material into the atmosphere so that the partial pressure in terms of hydrogen gas is in the range of 40 Pa to 400 Pa. That is, it is possible to enlarge the pulling speed margin and thus to easily manufacture a wafer including the Pv and Pi regions and excluding the COP defects and the dislocation clusters in the entire region in the crystal diameter direction.

In the second aspect of the invention, it is preferable that the ingot is pulled so that the Pv region is not present in the region within 20 mm in the diameter direction from the outer peripheral edge of the wafer toward the center of the wafer and the other region includes the Pi region. For this purpose, for example, the V/G in the pulling atmosphere not containing hydrogen can be set to be in the range of 0.22 to 0.15 $(mm^2)/(°C.min)$.

According to the second aspect of the invention, the method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes: a silicon single crystal pulling process of pulling a straight body portion of a silicon single crystal using the Czochralski method so as to include a defect-free region not having grown-in defects and an OSF region; a mirror treatment process of mirror finishing a sliced wafer; and a precipitation, dissolution, and thermal treatment process of treating a wafer in the atmosphere of non-oxidizing gas not containing nitrogen in the treatment temperature range of 1225° C. to 1350° C., the retention time range of 5 sec to 1 min, and the temperature-falling rate range of 10° C./sec to 0.1° C./sec, and the precipitation, dissolution, and thermal treatment process is performed before or after the mirror treatment process.

In this way, by setting the temperature condition in the precipitation, dissolution, and thermal treatment process to be higher than the temperature condition in the state not containing the OSF defects, it is possible to achieve both the prevention of generation of wafer deformation and the prevention of generation of a slip.

In the second aspect of the invention, by using a mixed atmosphere of non-oxidizing gas not containing 3% or more of nitrogen and oxygen gas as the treatment atmosphere in the precipitation, dissolution, and thermal treatment process, it is possible to achieve both the prevention of generation of wafer deformation and the prevention of generation of a slip.

In the method of manufacturing a silicon wafer according to the second aspect of the invention, the initial oxygen concentration Oi in the silicon single crystal pulling process may be set to be in the range of $12.0 \times 10^{17}$ to $20 \times 10^{17}$ atoms/cm$^3$ (Old-ASTM). In this way, by setting the silicon single crystal to a high oxygen concentration by the setting at the time of pulling, it is also possible to achieve both the prevention of generation of wafer deformation and the prevention of generation of a slip.

The silicon wafer according to the second aspect of the invention is manufactured by the use of the above-mentioned methods of manufacturing a silicon wafer. Accordingly, it is possible to achieve both the prevention of generation of the deformation such as a warp of the wafer, which causes the overlay error shown in FIG. 6, and the prevention of generation of the slip dislocation in the edge of the wafer, which is supported as shown in FIG. 5.

<Third Aspect>

(C1) A third aspect of the invention provides a method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: a silicon single crystal pulling process of pulling a straight body portion of a silicon single crystal as a region having void defects using the Czochralski method; a precipitation, dissolution, and thermal treatment process of treating a wafer in the atmosphere of non-oxidizing gas not containing nitrogen in the treatment temperature range of 950° C. to 1200° C., the retention time range of 5 sec to 1 min, and the temperature-falling rate range of 10° C./sec to 0.1° C./sec; and a DZ treatment process of performing high-temperature annealing treatment on a sliced wafer in the atmosphere of non-oxidizing gas of $H_2$ and/or Ar at 1100° C. or higher for 30 min or more to eliminate the void defect in the wafer surface layer which is a device forming region after the precipitation, dissolution, and thermal treatment process.

(C2) The third aspect of the invention provides a method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: a silicon single crystal pulling process of pulling a straight body portion of a silicon single crystal as a region being doped with nitrogen of $1\times10^{13}$ to $5\times10^{14}$ atoms/cm$^3$ and having a void defect using the Czochralski method; a precipitation, dissolution, and thermal treatment process of treating a wafer in the atmosphere of non-oxidizing gas not containing nitrogen in the treatment temperature range of 1225° C. to 1350° C., the retention time range of 5 sec to 1 min, and the temperature-falling rate range of 10° C./sec to 0.1° C./sec; and a DZ treatment process of performing high-temperature annealing treatment on a sliced wafer in the atmosphere of non-oxidizing gas of $H_2$ and/or Ar at 1100° C. or higher for 30 min or more to eliminate the void defect in the wafer surface layer which is a device forming region after the precipitation, dissolution, and thermal treatment process.

(C3) In the method of manufacturing a silicon wafer described in (C1) or (C2), the treatment atmosphere in the precipitation, dissolution, and thermal treatment process may be set to a mixed atmosphere of non-oxidizing gas not containing 1% or more of nitrogen and oxygen gas.

(C4) In the method of manufacturing a silicon wafer described in any one of (C1) to (C3), the initial oxygen concentration Oi in the silicon single crystal pulling process may be set to be in the range of $12.0\times10^{17}$ to $18\times10^{17}$ atoms/cm$^3$ (Old-ASTM).

(C5) A silicon wafer according to the third aspect of the invention is manufactured by the method of manufacturing a silicon wafer described in any one of (C1) to (C4).

(C6) In the silicon wafer described in (C5), the oxygen precipitate density may be equal to or less than $1\times10^4$ pcs/cm$^2$ after performing thermal treatment at 1000° C. for 16 hours.

According to the third aspect of the invention, the method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes: a silicon single crystal pulling process of pulling a straight body portion of a silicon single crystal as a region having a void defect using the Czochralski method; a precipitation, dissolution, and thermal treatment process of treating a wafer in the atmosphere of non-oxidizing gas not containing nitrogen in the treatment temperature range of 950° C. to 1200° C., the retention time range of 5 sec to 1 min, and the temperature-falling rate range of 10° C./sec to 0.1° C./sec; and a DZ treatment process of performing high-temperature annealing treatment on a sliced wafer in the atmosphere of non-oxidizing gas of $H_2$ and/or Ar at 1100° C. or higher for 30 min or more to eliminate the void defect in the wafer surface layer which is a device forming region after the mirror treatment process.

By performing the precipitation, dissolution, and thermal treatment process on the wafer in the atmosphere of non-oxidizing gas not containing nitrogen in the treatment temperature range of 950° C. to 1200° C., the retention time range of 5 sec to 1 min, and the temperature-falling rate range of 10° C./sec to 0.1° C./sec before performing the DZ treatment process, it is possible to prevent the deformation even when it is provided to the rapid temperature-rising-and-falling thermal treatment process. Accordingly, even in a so-called annealed wafer which is manufactured by pulling an ingot at a high pulling speed, which includes the V region having void defects, and in which the BMD can be easily formed, the oxygen precipitation nuclei causing the deformation can be dissolved through the use of the precipitation, dissolution, and thermal treatment processes. Therefore, even when the annealed wafer is provided to the rapid temperature-rising-and-falling thermal treatment process of the device manufacturing processes in which the conditions are more severe than those of the past RTA process and of which the maximum stress generated in the silicon wafer is greater than 20 MPa, it is possible to prevent the deformation. In addition, it is possible to prevent the slip extension resulting from the boat scratches and the transfer scratches causing the lowering of the wafer strength.

The inventor et al. found conditions to be set at the time of pulling a single crystal using the Czochralski method as a countermeasure which can achieve both the prevention of generation of wafer deformation and the prevention of generation of a slip in the silicon wafer manufacturing process.

The silicon wafer according to the third aspect of the invention is manufactured by pulling the silicon single crystal at a high pulling speed at which the silicon single crystal having void defects can be pulled at the time of pulling the silicon single crystal by the use of the Czochralski method.

In the invention, if a silicon single crystal has void defects, it means that it includes the V region having defects such as the COP defects which may be generated at the time of pulling a crystal, without the grown-in defects free. That is, this means that it includes the COP generation region and it may include the OSF region, the Pv region, and the Pi region only when it includes the V region.

In the third aspect of the invention, the wafer including the COP defects means a wafer in which the number of LPDs (Light Point Defects) of 0.09 μm or more is 100 pcs/wf or more.

In the third aspect of the invention, for example, the V/G has only to be set to 0.22 or more so as to pull a crystal to include the V region.

In the third aspect of the invention, a wafer in which the number of LPDs with a size of 0.09 μm or more is 100 pcs/wf or more when the LPD density is measured by the use of a laser scattering particle counter (SP1 (surfscan SP1) which is a product made by KLA-Tencor Corporation) is employed as the wafer to be subjected to the DZ treatment. That is, the wafer including the COP defects is formed by slicing a pulled ingot doped with nitrogen and the COP defects are present with the above-mentioned wafer in-plane density (the number on the entire wafer surface/the wafer area) therein. That is, the wafer including the void defects on the entire surface thereof and the wafer partially including the OSF-ring region are subjected to the treatment.

In the nitrogen-doped wafer according to the third aspect of the invention, the OSF-ring region tends to extend to the void region, but may include the OSF region or the Pv region.

According to the third aspect of the invention, the method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes: a silicon single crystal pulling process of pulling a straight body portion of a silicon single crystal as a region being doped with nitrogen of $1\times10^{13}$ to $5\times10^{14}$ atoms/cm$^3$ and having a void defect using the Czochralski method; a precipitation, dissolution, and thermal treatment process of treating a wafer in the atmosphere of non-oxidizing gas not containing nitrogen in the treatment temperature range of 1225° C. to 1350° C., the retention time range of 5 sec to 1 min, and the temperature-falling rate range of 10° C./sec to 0.1° C./sec;

and a DZ treatment process of performing high-temperature annealing treatment on a sliced wafer in the atmosphere of non-oxidizing gas of $H_2$ and/or Ar at 1100° C. or higher for 30 min or more to eliminate the void defect in the wafer surface layer which is a device forming region after the mirror treatment process.

According to the method of manufacturing a silicon wafer, by setting the temperature condition in the precipitation, dissolution, and thermal treatment process to be higher than the temperature condition in the state not containing nitrogen, it is possible to achieve both the prevention of generation of wafer deformation and the prevention of generation of a slip even in the wafer including nitrogen in which the BMDs are easily formed.

In the third aspect of the invention, by using a mixed atmosphere of non-oxidizing gas not containing nitrogen and oxygen gas of 1% or more as the treatment atmosphere in the precipitation, dissolution, and thermal treatment process, it is possible to achieve both the prevention of generation of wafer deformation and the prevention of generation of a slip.

In the method of manufacturing a silicon wafer according to the third aspect of the invention, the initial oxygen concentration Oi in the silicon single crystal pulling process may be set to be in the range of $12.0 \times 10^{17}$ to $18 \times 10^{17}$ atoms/cm$^3$ (Old-ASTM). Accordingly, even when the oxygen concentration in the wafer is set to be high by the setting at the time of pulling, it is also possible to achieve both the prevention of generation of wafer deformation and the prevention of generation of a slip.

The silicon wafer according to the third aspect of the invention is manufactured by the use of the above-mentioned methods of manufacturing a silicon wafer and the oxygen precipitate density becomes $1 \times 10^4$ pcs/cm$^2$ after the thermal treatment at 1000° C. for 16 hours. According to this silicon wafer, it is possible to achieve both the prevention of generation of the deformation such as a warp of the wafer, which causes the overlay error shown in FIG. 6, and the prevention of generation of the slip dislocation in the edge of the wafer, which is supported as shown in FIG. 5.

<Fourth Aspect>

(D1) A fourth aspect of the invention provides a method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec, the method including: a pulling process of pulling a silicon single crystal using the Czochralski method; and a mirror treatment process of mirror finishing a sliced wafer, wherein the pulling process is performed so that a straight body portion of the silicon single crystal is pulled as a defect-free region not having grown-in defects, a Pv region which is a vacancy-dominant defect-free region distributed concentrically in the outer peripheral edge of a wafer obtained by slicing the silicon single crystal is not present in a region within 20 mm in the diameter direction from the outer peripheral edge of the wafer to the center of the wafer, and the other region includes a Pi region which is an interstitial-silicon-dominant defect-free region.

(D2) In the method of manufacturing a silicon wafer described in (D1), the pulling process may be performed so that the entire surface of the wafer includes the Pi region which is the interstitial-silicon-dominant defect-free region.

(D3) In the method of manufacturing a silicon wafer described in (D1) or (D2), pulling conditions in the pulling process may be set so that the oxygen precipitate density in the Pi region which is the interstitial-silicon-dominant defect-free region is equal to or less than $1 \times 10^{14}$ pcs/cm$^2$ after performing thermal treatment at 800° C. for 4 hours and thermal treatment at 1000° C. for 16 hours.

(D4) In the method of manufacturing a silicon wafer described in any one of (D1) to (D3), the initial oxygen concentration Oi in the pulling process may be set to be in the range of $12.0 \times 10^{17}$ to $14 \times 10^{17}$ atoms/cm$^3$ (Old-ASTM).

(D5) A silicon wafer according to the fourth aspect of the invention is manufactured by the method of manufacturing a silicon wafer described in any one of (D1) to (D3).

According to the fourth aspect of the invention, the method of manufacturing a silicon wafer which is provided to a semiconductor device manufacturing process having a thermal treatment process of which the highest temperature is equal to or higher than 1050° C. and equal to or lower than the melting point of silicon and of which the temperature rising and falling rate is equal to or higher than 150° C./sec includes: a pulling process of pulling a silicon single crystal using the Czochralski method; and a mirror treatment process of mirror finishing a sliced wafer. Here, the pulling process is performed so that a straight body portion of the silicon single crystal is pulled as a defect-free region not having grown-in defects, a Pv region which is a vacancy-dominant defect-free region distributed concentrically in the outer peripheral edge of a wafer obtained by slicing the silicon single crystal is not present in a region within 20 mm in the diameter direction from the outer peripheral edge of the wafer to the center of the wafer, and the other region includes a Pi region which is an interstitial-silicon-dominant defect-free region.

In the method of manufacturing a silicon wafer according to the fourth aspect, it is possible to suppress the slip extension in the outer peripheral edge by excluding the Pv region. Since the defect-free region is provided, the precipitates are not formed in the outer peripheral edge of the wafer in the device processes. Therefore, it is possible to manufacture a wafer having excellent slip resistance without performing the precipitation, dissolution, and thermal treatment process used to dissolve the oxygen precipitation nuclei causing the deformation. Accordingly, even when the wafer obtained by the use of the manufacturing method according to this aspect is provided to the rapid temperature-rising-and-falling thermal treatment process of the device manufacturing processes of which the conditions are more severe than those in the past RTA process and are severe conditions in which the highest temperature is in the range of 1050° C. to the melting point of silicon, the temperature rising and falling rate is in the range of 150° C./sec to 10000° C./sec, preferably in the range of 500° C./sec to 3000° C./sec, and more preferably in the range of 1000° C./sec to 2000° C./sec, and the maximum stress generated in the silicon wafer is greater than 20 Mpa, it is possible to prevent the deformation of the wafer. In addition, it is also possible to provide a silicon wafer which can prevent the slip extension resulting from boat scratches and transfer scratches causing the lowering of the wafer strength.

The inventor et al. found conditions to be set at the time of pulling a single crystal using the Czochralski method as a countermeasure which can achieve both the prevention of generation of wafer deformation and the prevention of generation of a slip in the silicon wafer manufacturing process.

The silicon single crystal used for the silicon wafer according to the fourth aspect of the invention is pulled at a pulling speed at which a silicon single crystal with grown-in defects free can be pulled at the time of pulling the silicon single crystal using the Czochralski method.

The "grown-in defects are free" in the invention means that all defects which may be generated at the time of pulling a crystal, such as COP defects or dislocation clusters, are excluded, the OSF region can be excluded, and the Pv region and the Pi region are included.

When the silicon single crystal used in the silicon wafer according to the fourth aspect of the invention is pulled by the use of the Czochralski method, a hydrogen-containing material having a partial pressure in terms of hydrogen gas in the range of 40 Pa to 400 Pa is introduced into the atmosphere gas in the CZ furnace and the silicon single crystal pulling speed is set to a speed at which a silicon single crystal with grown-in defects free can be pulled. The atmosphere containing only the inert gas and not containing hydrogen gas may be employed.

Similarly to the hydrogen-containing material described in the second aspect, the hydrogen-containing material is a material containing a hydrogen atom in its molecule and is a gaseous material which is thermally decomposed to generate hydrogen gas when it is melted in the silicon melt.

In the method of manufacturing a silicon single crystal wafer according to the fourth aspect of the invention, the allowable range of the speed at which the silicon single crystal with grown-in defects free can be pulled can be widened by introducing the hydrogen-containing material into the atmosphere so that the partial pressure in terms of hydrogen gas is in the range of 40 Pa to 400 Pa. That is, it is possible to enlarge the pulling speed margin and thus to easily manufacture a wafer including the Pv and Pi regions and excluding the COP defects and the dislocation clusters in the entire region in the crystal diameter direction.

In the fourth aspect of the invention, it is preferable that the ingot is pulled so that the Pv region is not present in the region within 20 mm in the diameter direction from the outer peripheral edge of the wafer toward the center of the wafer and the other region includes the Pi region. For this purpose, for example, the V/G in the pulling atmosphere not containing hydrogen can be set to be in the range of 0.20 to 0.15 (mm$^2$)/(° C.min).

In the fourth aspect of the invention, it is preferable that the pulling process is performed so that the entire surface of the wafer includes the Pi region which is the interstitial-silicon-dominant defect-free region. In the wafer manufacturing method according to the fourth aspect, it is possible to manufacture a wafer which can prevent the oxygen precipitates from being formed in the outer peripheral edge, prevent the deformation resulting from the precipitates on the entire wafer surface, and prevent the generation of a slip.

In the fourth aspect of the invention, it is preferable that pulling conditions in the pulling process are set so that the oxygen precipitate density in the Pi region which is the interstitial-silicon-dominant defect-free region is equal to or less than $1 \times 10^{14}$ pcs/cm$^2$ after performing thermal treatment at 800° C. for 4 hours and thermal treatment at 1000° C. for 16 hours. In the wafer manufacturing method according to the fourth aspect, it is possible to achieve both the prevention of generation of wafer deformation and the prevention of generation of a slip.

In the method of manufacturing a silicon wafer according to the fourth aspect of the invention, the initial oxygen concentration Oi in the silicon single crystal pulling process may be set to be in the range of $12.0 \times 10^{17}$ to $14 \times 10^{17}$ atoms/cm$^3$ (Old-ASTM). In the wafer manufacturing method according to the fourth aspect, even when the wafer has a high oxygen concentration by the setting at the time of pulling, it is also possible to achieve both the prevention of generation of wafer deformation and the prevention of generation of a slip.

The silicon wafer according to the fourth aspect of the invention is manufactured by the use of the above-mentioned methods of manufacturing a silicon wafer. By employing the wafer according to the fourth aspect, it is possible to achieve both the prevention of generation of the deformation such as a warp of the wafer, which causes the overlay error shown in FIG. 6, and the prevention of generation of the slip dislocation in the edge of the wafer, which is supported as shown in FIG. 5.

In the wafers or the manufacturing processes related to the device manufacturing according to the first aspect, the second aspect, the third aspect, and the fourth aspect, the deformation such as a warp of a wafer and the slip dislocation in the edge can be determined on the basis of slip lengths. Specifically, as described later, the slip length of 0.5 to 2 mm is evaluated as O (A: Good), the slip length of 2 to 5 mm is evaluated as Δ (B: Acceptable), and the slip length of 5 to 10 mm is evaluated as X (C: Not Acceptable).

Advantageous Effects of Invention

According to the first aspect, the second aspect, the third aspect, and the fourth aspect of the invention, even when the wafer is provided to the rapid temperature-rising-and-falling thermal treatment process of the device manufacturing processes of which the conditions are more severe than those in the past RTA process and the maximum stress generated in the silicon wafer is greater than 20 Mpa, it is possible to provide a silicon wafer or a silicon epitaxial wafer which can reduce the oxygen precipitates to prevent the deformation of the wafer. In addition, it is also possible to provide a silicon wafer which can prevent the slip extension resulting from boat scratches and transfer scratches causing the lowering of the wafer strength.

BEST MODE FOR CARRYING OUT THE INVENTION

First Embodiment

Hereinafter, a silicon epitaxial wafer and a manufacturing method thereof according to a first embodiment of the invention will be described with reference to the accompanying drawings.

Figure 1:
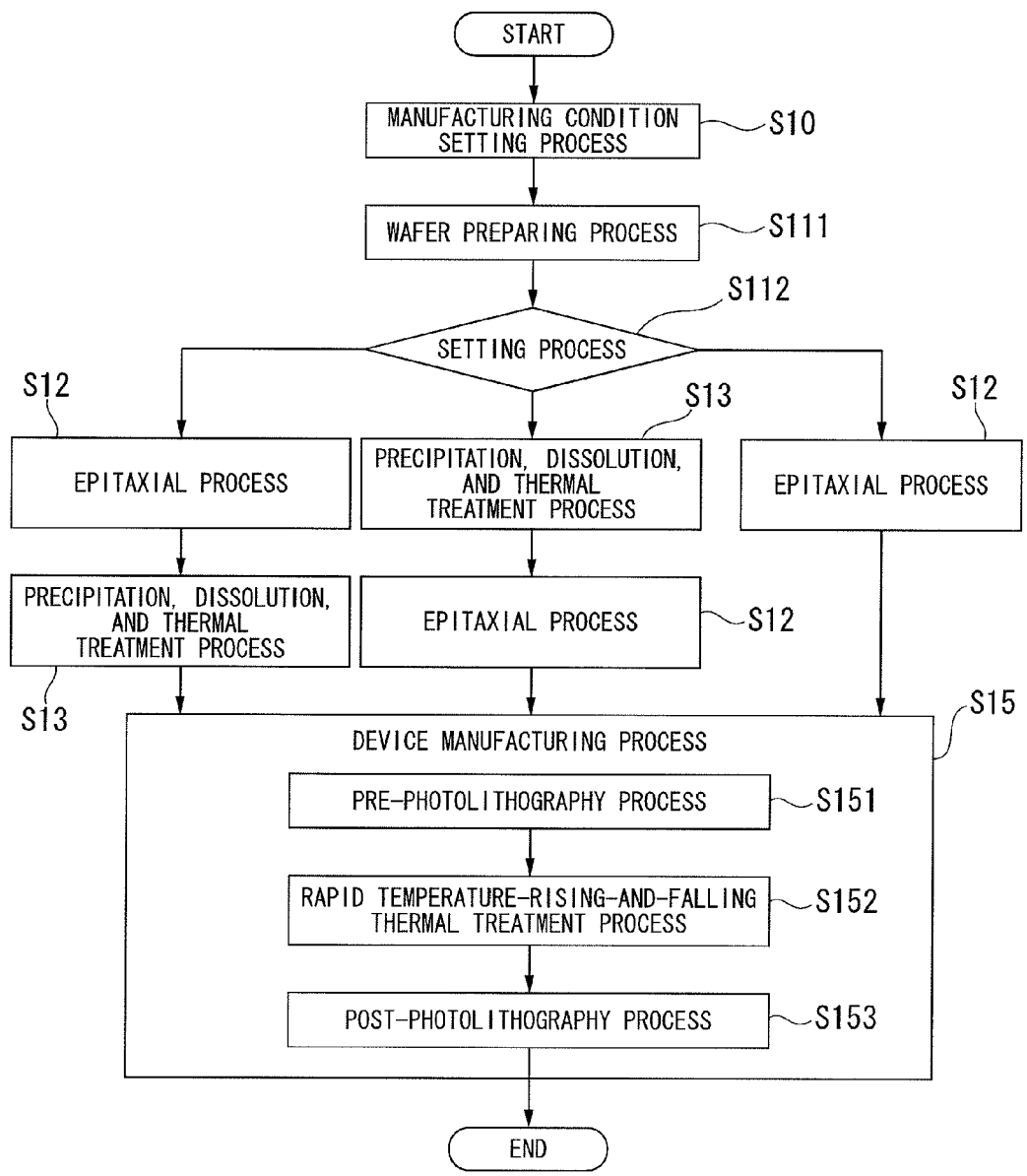
FIG. 1 is a flowchart illustrating a method of manufacturing a silicon epitaxial wafer according to a first aspect of the invention.

FIG. 1 is a flowchart illustrating a manufacturing method of a silicon epitaxial wafer according to the first embodiment of the invention.

The method of manufacturing a silicon epitaxial wafer according to the first embodiment includes a manufacturing condition setting process S10, a wafer preparing process S111, a setting process S112 of setting conditions in a precipitation, dissolution, and thermal treatment process, an epitaxial process S12, and a precipitation, dissolution, and thermal treatment process S13, as shown in FIG. 1. The manufactured silicon epitaxial wafer is provided to a device manufacturing process S15 including a rapid temperature-rising-and-falling thermal treatment process S152.

In the manufacturing condition setting process S10 shown in FIG. 1, the standards of a wafer provided to the device manufacturing process S15 or the conditions at the time of pulling a silicon single crystal from a silicon melt by the use of the CZ (Czochralski) method in the wafer preparing process S111 are set.

In the manufacturing condition setting process S10, the oxygen concentration Oi of a silicon wafer (substrate) serving as a parameter to be controlled at the time of pulling and the boron concentration and the nitrogen concentration as the dopant concentrations are set as process requirements in the wafer preparing process S111.

The wafer preparing process S111 is a process of preparing a silicon wafer on which an epitaxial layer is formed. In the wafer preparing process S111, a single crystal is pulled by the use of the CZ method, the pulled silicon single crystal ingot is sliced to form a wafer, and the wafer is subjected to surface treatment such as chamfering, grinding, polishing, and cleaning. The diameter of the silicon wafer may be in the range of 300 mm to 450 mm.

The setting process S112 shown in FIG. 1 is a process of setting processing conditions in the precipitation, dissolution, and thermal treatment process S13 so as to suppress the generation of a wafer deformation and the generation of a slip in the rapid temperature-rising-and-falling thermal treatment process S152.

The surface of the silicon wafer prepared in the wafer preparing process S111 is made to epitaxially grow through the use of the epitaxial process S12. The resultant silicon epitaxial wafer is provided to the device manufacturing process S15. The device manufacturing process S15 includes the rapid temperature-rising-and-falling thermal treatment process S152 such as the FLA process. In the setting process S112, the stress generated in the wafer in the rapid temperature-rising-and-falling thermal treatment process S152 and the oxygen precipitation required for the stress are set to desired states. In the device manufacturing process S15, the thermal treatment provided with the silicon wafer is the rapid temperature-rising-and-falling thermal treatment process S152 in which the temperature rising and falling rate is 150° C./sec or higher in the highest temperature range of 1050° C. to the melting point of silicon. The treatment conditions in the precipitation, dissolution, and thermal treatment process S13 are determined in the setting process S112 so that a pattern formed in a pre-photolithography process S151 and a pattern formed in a post-photolithography process S153 before and after the rapid temperature-rising-and-falling thermal treatment process S152 are not misaligned to cause the overlay error, whereby the generation of a deformation and the generation of a slip are suppressed in the rapid temperature-rising-and-falling thermal treatment process S152. In the setting process S112, the order of the precipitation, dissolution, and thermal treatment process S13 and the epitaxial process S12 is also set. At this time, the precipitation, dissolution, and thermal treatment process S13 may not be performed. That is, in the setting process S112, the conditions in the precipitation, dissolution, and thermal treatment process S13 are determined in consideration of the conditions in the manufacturing condition setting process S10 and the conditions in the rapid temperature-rising-and-falling thermal treatment process S152.

The followings can be selected as the conditions in the manufacturing condition setting process S10 and the setting process S112.

In the manufacturing condition setting process S10, boron is doped so that the resistivity is in the range of 0.02 Ωcm to 1 kΩcm and the initial oxygen concentration Oi is set to be in the range of $14.0 \times 10^{17}$ to $22 \times 10^{17}$ atoms/cm$^3$ (Old-ASTM). In the setting process S112, the treatment temperature is set to be in the range of 1150° C. to 1300° C., the retention time is set to be in the range of 5 sec to 1 min, and the temperature-falling rate is set to be in the range of 10° C./sec to 0.1° C./sec. At this time, the initial oxygen concentration Oi has only to be in the range of $15.0 \times 10^{17}$ to $20 \times 10^{17}$ atoms/cm$^3$. Preferably, the treatment temperature is set to be in the range of 1175° C. to 1250° C., the retention time is set to be in the range of 10 sec to 30 sec, and the temperature-falling rate is set to be in the range of 8° C./sec to 0.5° C./sec.

In the manufacturing condition setting process S10, nitrogen of $1 \times 10^{13}$ to $5 \times 10^{14}$ atoms/cm$^3$ is doped. In the setting process S112, the precipitation, dissolution, and thermal treatment process S13 is set to be performed after the epitaxial process S12, the treatment temperature is set to be in the range of 1200° C. to 1300° C., the retention time is set to be in the range of 5 sec to 1 min, and the temperature-falling rate is set to be in the range of 10° C./sec to 0.1° C./sec. Preferably, the treatment temperature is set to be in the range of 1225° C. to 1275° C., the retention time is set to be in the range of 10 sec to 30 sec, and the temperature-falling rate is set to be in the range of 8° C./sec to 0.5° C./sec.

In the manufacturing condition setting process S10, boron is doped so that the resistivity is in the range of 0.02 Ωcm to 0.001 Ωcm and the initial oxygen concentration Oi is set to be in the range of $11.0 \times 10^{17}$ to $3 \times 10^{17}$ atoms/cm$^3$ (Old-ASTM). In the setting step S112, the precipitation, dissolution, and thermal treatment process S13 is set not to be performed. More preferably, the initial oxygen concentration Oi is set to be in the range of $10 \times 10^{17}$ to $5 \times 10^{17}$ atoms/cm$^3$.

In the manufacturing condition setting process S10, boron is doped so that the resistivity is in the range of 0.02 Ωcm to 0.001 Ωcm and the initial oxygen concentration Oi is set to be in the range of $11.0 \times 10^{17}$ to $18 \times 10^{17}$ atoms/cm$^3$ (Old-ASTM). In the setting process S112, the precipitation, dissolution, and thermal treatment process S13 is set to be performed before the epitaxial process S12, the treatment temperature is set to be in the range of 1150° C. to 1300° C., the retention time is set to be in the range of 5 sec to 1 min, and the temperature-falling rate is set to be in the range of 10°

C./sec to 0.1° C./sec. Preferably, the initial oxygen concentration Oi is set to be in the range of $12.0\times10^{17}$ to $16\times10^{17}$ atoms/cm$^3$. Preferably, the treatment temperature is set to be in the range of 1175° C. to 1275° C., the retention time is set to be in the range of 10 sec to 45 sec, and the temperature-falling rate is set to be in the range of 8° C./sec to 0.5° C./sec.

In the setting process S112, a non-oxidizing gas atmosphere not containing nitrogen is set as the treatment atmosphere in the precipitation, dissolution, and thermal treatment process S13. A mixed atmosphere of non-oxidizing gas not containing nitrogen and oxygen gas of 1% or more may be used as the treatment atmosphere in the precipitation, dissolution, and thermal treatment process S13. A mixed atmosphere of non-oxidizing gas not containing nitrogen and oxygen gas of 3% or more may be used as the treatment atmosphere in the precipitation, dissolution, and thermal treatment process S13 and the temperature-falling rate may be set to be in the range of 50° C./sec to 20° C./sec. The oxygen gas in the mixed atmospheres may be 10% or less and is preferably 5% or less.

In the epitaxial process S12 shown in FIG. 1, an epitaxial layer is formed on the wafer surface to be of, for example, a p/p-type. This means a wafer in which a p-type epitaxial layer with a thickness of 1 to 10 μm is stacked on a p-type wafer. Here, the p-type of the boron (B) concentration means a concentration corresponding to the resistivity of 0.1 to 100 Ωcm and the p type means a concentration corresponding to the resistivity of 0.1 Ωcm to 100 Ωcm.

Figure 2:
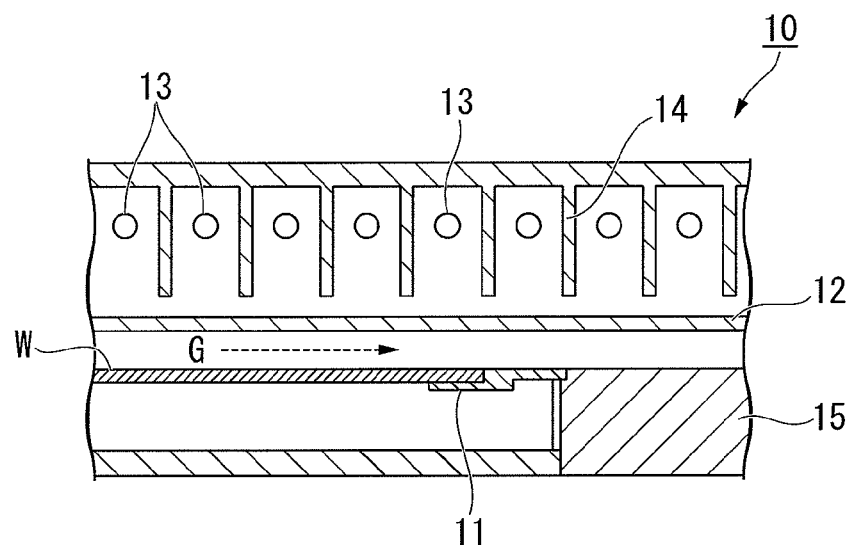
FIG. 2 is a sectional view schematically illustrating a part of an RTA apparatus.
Figure 3:
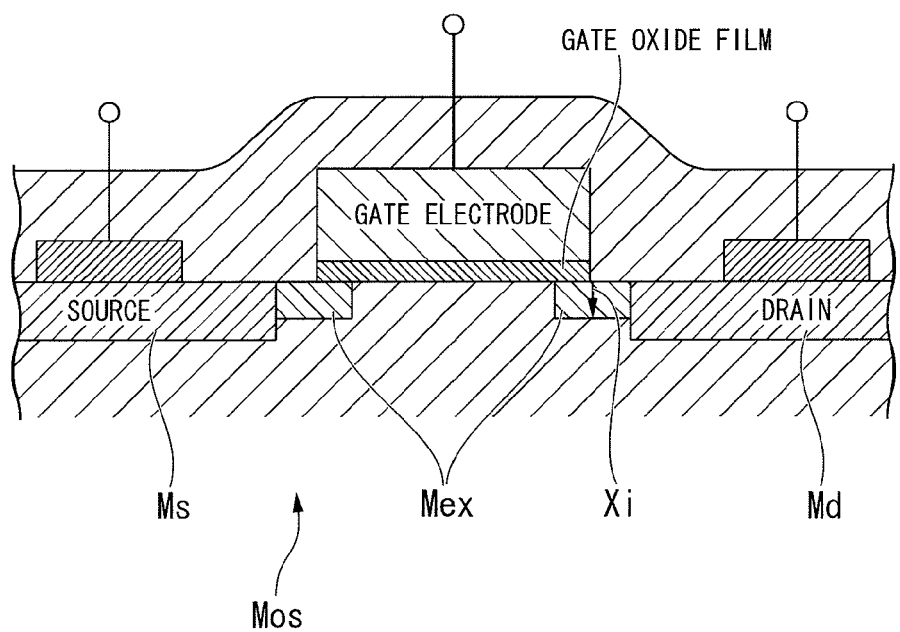
FIG. 3 is a sectional view schematically illustrating a MOS FET.
Figure 4:
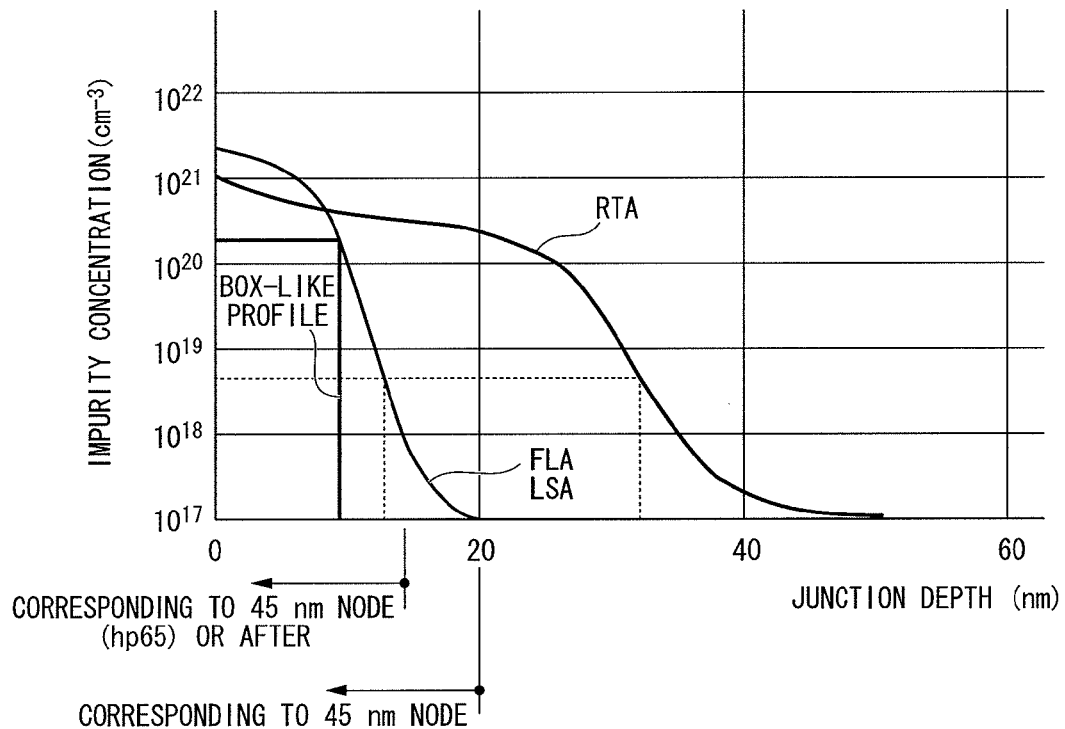
FIG. 4 is a graph illustrating a box-like dopant profile in the relationship between the dopant concentration and the junction depth.

The precipitation, dissolution, and thermal treatment process S13 shown in FIG. 1 is performed at a treatment temperature higher than the treatment temperature in the epitaxial process S12 under the above-mentioned conditions by an RTA apparatus 10. In the RTA apparatus 10, the edge of a wafer W is supported and kept horizontal by a ring-like edge ring 11 formed of SiC and disposed in the furnace, as shown in FIG. 2. By heating the wafer W by the use of plural lamps 13 via an upper dome 12 formed of transparent quartz or the like in the atmosphere of the above-mentioned atmosphere gas G, sources serving as precipitation nuclei in the wafer W are dissolved. The lamps 13 in the RTA apparatus 10 are disposed in reflectors 14 of which the surface is plated with gold or the like, respectively. The upper dome 12 and a lower dome (not shown) are connected to each other by a wall 15 formed of SUS (stainless steel) and a chamber (furnace) is constructed thereby.

In the device manufacturing process S15 shown in FIG. 1, processes necessary for forming devices based on the 65 nm node or the 45 nm node on the silicon wafer are performed. The device manufacturing process S15 includes the rapid temperature-rising-and-falling thermal treatment process S152 such as a spike-RTA process or an FLA process.

Figure 5:
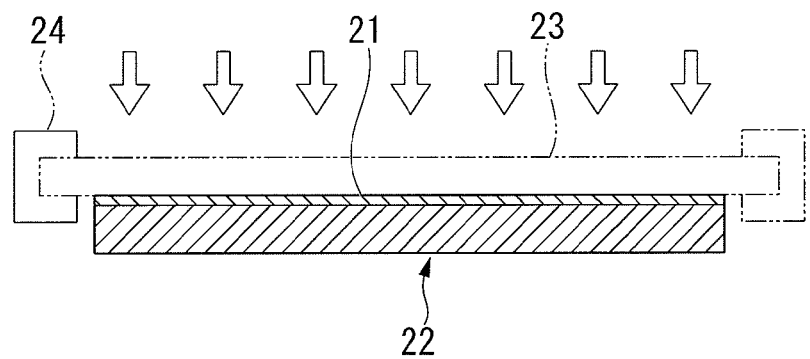
FIG. 5 is a sectional view of a work stage in a past exposing apparatus.

In the pre-photolithography process S151 and the post-photolithography process S153 shown in FIG. 1, as shown in FIG. 5, a wafer 21 is supported and fixed onto a work stage 22 by vacuum suction, a photomask 23 is supported and fixed onto a mask holder 24 above the work stage 22. Thereafter, the work stage 22 is lifted up to bring the thin wafer 21 into close contact with the photomask 23, and then the wafer is exposed. A photoresist film (not shown) is formed on the surface of the wafer 21 in advance and the photoresist film is exposed to bake a pattern of the photomask 23.

Figure 6:
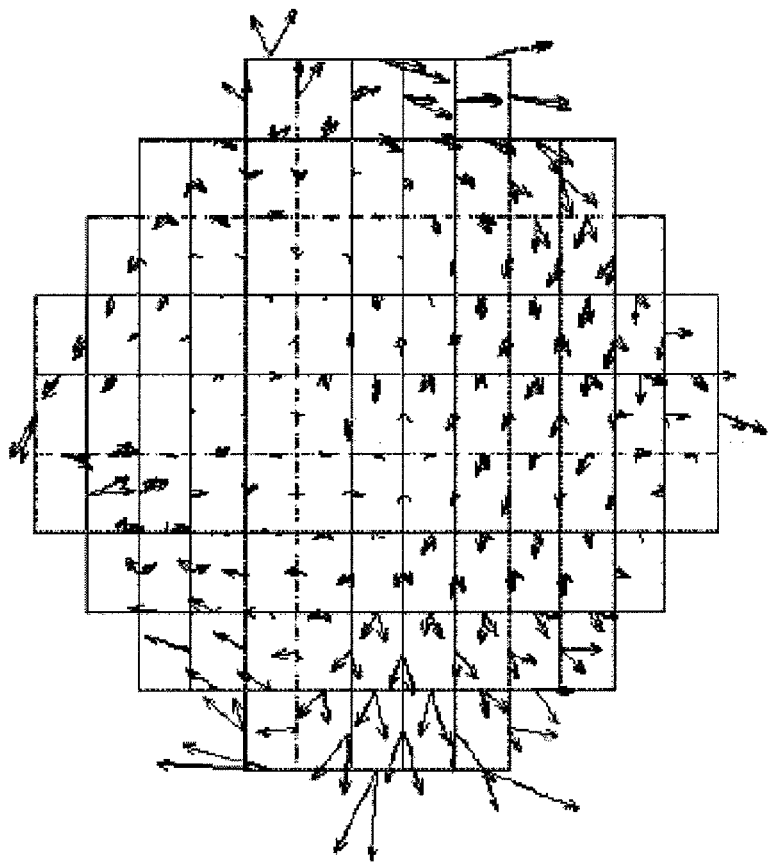
FIG. 6 is a plan view illustrating overlay errors.
Figure 7:
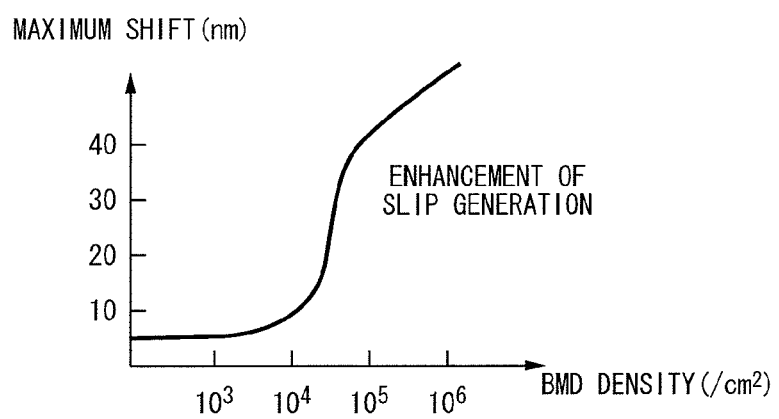
FIG. 7 is a graph illustrating the relationship between the BMD density and the maximum shift due to the generation of a slip.

In the method of manufacturing a silicon epitaxial wafer according to the first embodiment, in the setting process S112, the conditions in the precipitation, dissolution, and thermal treatment process S13 are determined in consideration of the conditions in the manufacturing condition setting process S10 and the conditions in the rapid temperature-rising-and-falling thermal treatment process S152. The processes are performed on the basis of the determined conditions. Therefore, in the silicon epitaxial wafer according to the first embodiment, precipitates with a density and a size greater than $5\times10^4$ pcs/cm$^2$ which causes the slip dislocation in the wafer are not formed. Accordingly, as shown in FIG. 5, even when the wafer 21 is supported and fixed onto the work stage 22 by vacuum suction, the maximum shift shown in FIG. 7 and resulting from the precipitates is not greater than 10 nm which is the allowable reference. That is, the deformation of a warp causing the overlay error shown in FIG. 6 is not generated.

Figure 8:
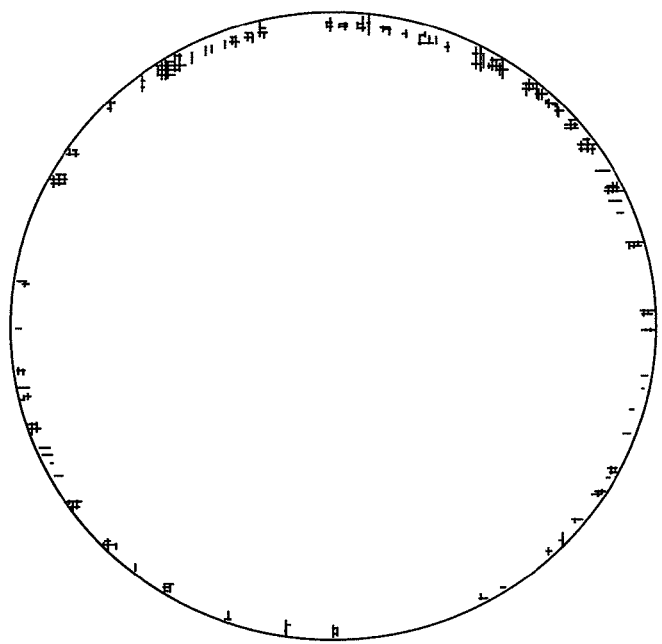
FIG. 8 is a diagram illustrating a state where slip dislocations are generated in a wafer edge through the use of X-ray topography.

In addition, in the silicon epitaxial wafer according to the first embodiment, it is possible to prevent the slip dislocation from being generated in the edge of the wafer W supported as shown in FIG. 8 and thus to prevent the strength of the wafer from being lowered.

When the spike-RTA process is performed as the rapid temperature-rising-and-falling thermal treatment process S152, the conditions can be set and the process can be performed by the use of the RTA apparatus 10 shown in FIG. 2.

Second Embodiment

Hereinafter, a silicon wafer and a manufacturing method thereof according to a second embodiment of the invention will be described with reference to the accompanying drawings.

Figure 10:
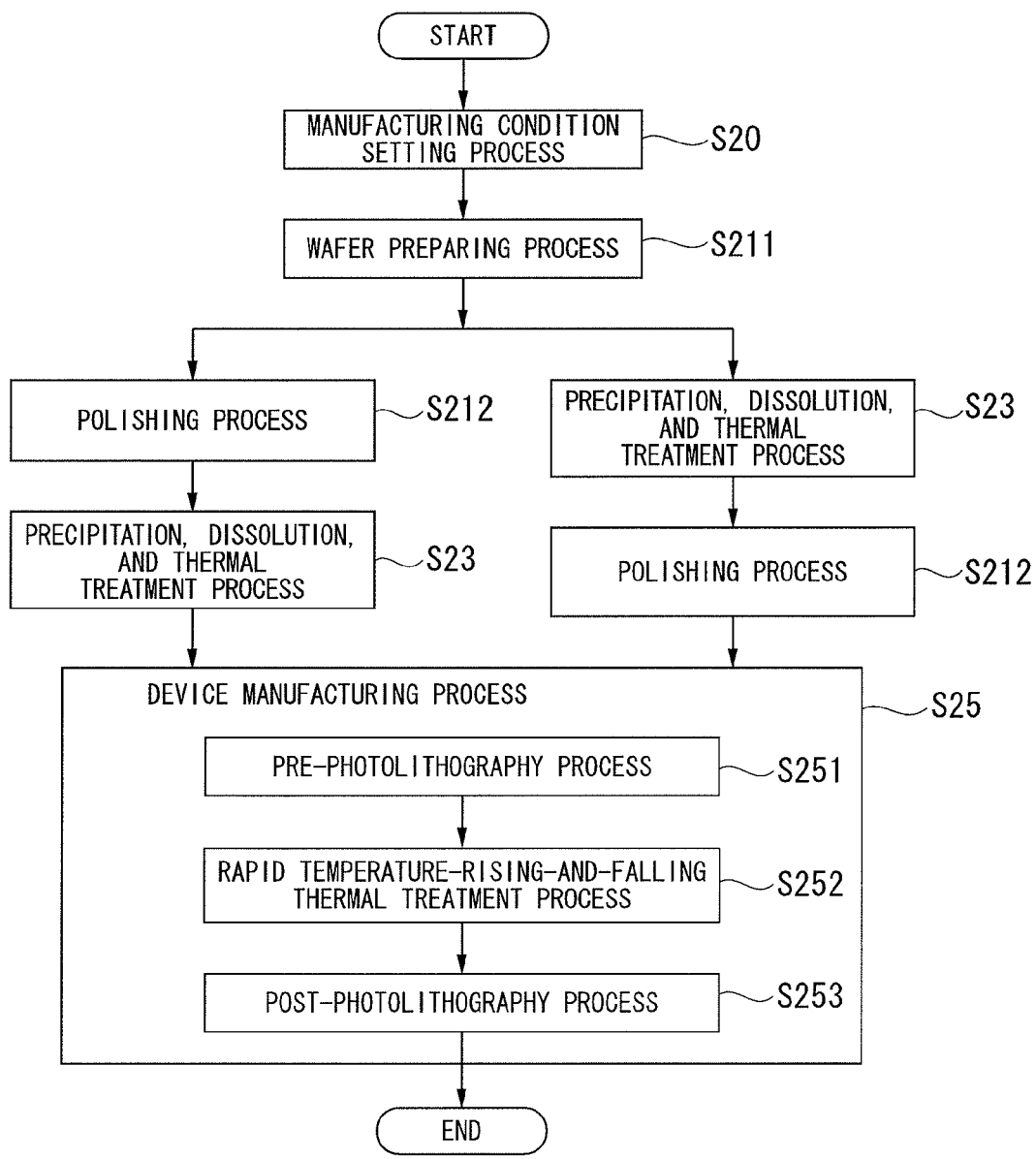
FIG. 10 is a flowchart illustrating a method of manufacturing a silicon wafer according to a second aspect of the invention.

FIG. 10 is a flowchart illustrating a silicon wafer and a manufacturing method thereof according to this embodiment.

The method of manufacturing a silicon wafer according to the second embodiment includes a manufacturing condition setting process S20, a wafer preparing process S211 including a pulling process, a polishing process S212, and a precipitation, dissolution, and thermal treatment process S23, as shown in FIG. 10. The silicon wafer manufactured through the precipitation, dissolution, and thermal treatment process S23 is provided to a device manufacturing process S25 including a rapid temperature-rising-and-falling thermal treatment process S252.

In the manufacturing condition setting process S20 shown in FIG. 10, the standards of a wafer provided to the device manufacturing process S25, the conditions at the time of pulling a silicon single crystal from a silicon melt by the use of the CZ (Czochralski) method in the wafer preparing process S211, and the conditions in the precipitation, dissolution, and thermal treatment process S23 are set. A stress is generated in the wafer depending on the conditions in the rapid temperature-rising-and-falling thermal treatment process S252 such as an FLA process of the semiconductor device manufacturing process S25 which is a subsequent process provided with the wafer. To prevent the generation of the stress, there is an oxygen precipitation state required for coping with the stress. In the manufacturing condition setting process S20, the conditions in the precipitation, dissolution, and thermal treatment process S23 are determined to set the oxygen precipitation state to a desired state. In the device manufacturing process S25, the thermal treatment provided with the silicon wafer is the rapid temperature-rising-and-falling thermal treatment process S252 in which the treatment time is set to be in the range of 1 μsec to 100 msec in the highest temperature range of 1100° C. to the melting point of silicon. The conditions for suppressing the generation of a deformation and the generation of a slip in the rapid temperature-rising-and-falling thermal treatment process S252 are determined in the manufacturing condition setting process S20 so that a pattern formed in a pre-photolithography process S251 and a pattern formed in a post-photolithography process S253 before and after the rapid temperature-rising-and-falling thermal treatment process S252 are not misaligned to cause the overlay error.

In the manufacturing condition setting process S20, the ratio of the pulling speed V and the temperature gradient G from the solid-liquid interface serving as a parameter to be controlled at the time of pulling, that is, the value of V/G, the oxygen concentration Oi of a silicon wafer (substrate), and the dopant concentrations are set as process requirements in the wafer preparing process S211.

In the wafer preparing process S211, a single crystal is pulled by the use of the CZ method by the use of a CZ furnace, the pulled silicon single crystal ingot is sliced to form a wafer, and the wafer is subjected to surface treatment such as chamfering, grinding, and cleaning. Thereafter, the silicon wafer is provided to the polishing process S212 as a finishing process. The diameter of the silicon wafer may be in the range of 300 mm to 450 mm.

Figure 11:
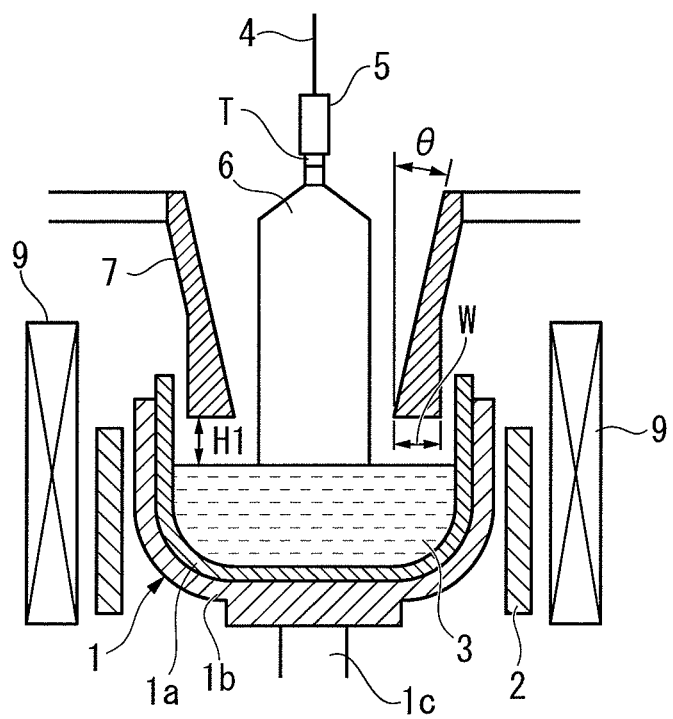
FIG. 11 is a schematic longitudinal sectional view of a CZ furnace used to perform the methods of manufacturing a silicon wafer according to the first to fourth aspects of the invention.

FIG. 11 is a longitudinal sectional view of a CZ furnace suitably used to perform the methods of manufacturing a silicon wafer according to the embodiments of the invention.

The CZ furnace shown in FIG. 11 includes a crucible 1 disposed at the center of a chamber, a heater 2 disposed outside of the crucible 1, and a magnetic field supply device 9 disposed outside the heater 2. The crucible 1 has a double structure in which a quartz crucible 1a containing a silicon melt 3 therein is supported by a graphite crucible 1b disposed outside and is driven to rotate and to move up and down by a support shaft 1c called pedestal.

A cylindrical heat insulating member 7 is disposed above the crucible 1. The heat insulating member 7 has a structure in which a shell formed of graphite is filled with graphite felt. The inner surface of the heat insulating member 7 is tapered so that the inner diameter gradually decreases from the top to the bottom. The upper outer surface of the heat insulating member 7 is tapered to correspond to the inner surface and the lower outer surface thereof is formed straight so that the thickness of the heat insulating member 7 gradually increases to the bottom.

A seed crystal T disposed on a seed chuck 5 is immersed in the silicon melt 3 and the seed crystal T is pulled while rotating the crucible 1 and a pulling shaft 4, whereby a silicon single crystal 6 can be formed.

The heat insulating member 7 serves to insulate radiant heat from the heater 2 and the silicon melt 3 to the side surface of the silicon single crystal, surrounds the side surface of the silicon single crystal 6 in pulling and the surface of the silicon melt 3. The specification of the heat insulating member 7 is as follows. The width W in the radial direction is, for example, 50 mm, the slope θ of the inner surface, which is an inverted truncated cone surface, about the vertical direction is, for example, 21°, and the height H1 of the bottom of the heat insulating member 7 from the melt surface is, for example, 60 mm. A horizontal magnetic field or a cusp magnetic field may be employed as the magnetic field to be applied from the magnetic field supply device 9. For example, the intensity of the horizontal magnetic field is in the range of 2000 to 4000 G (0.2 T to 0.4 T) and preferably in the range of 2500 to 3500 G (0.25 T to 0.35 T). The magnetic field center height is set to be in the range of −150 mm to +100 mm with respect to the melt surface and more preferably to the range of −75 mm to +50 mm.

In the wafer preparing process S211, first, 100 kg of high-purity polycrystalline silicon is input to the crucible 1 shown in FIG. 11 and necessary dopants are also input thereto to adjust the dopant concentrations in the polycrystalline silicon. Then, the inside of the CZ furnace is set to a hydrogen-containing atmosphere including mixed gas of a hydrogen-containing material and inert gas, the pressure of the atmosphere is set to be in the range of 1.3 to 13.3 kPa (10 to 100 Torr), and the concentration of the hydrogen-containing material in the atmosphere gas is adjusted so that the partial pressure thereof in terms of hydrogen gas is in the range of 40 to 400 Pa. When hydrogen gas is selected as the hydrogen-containing material, the partial pressure of the hydrogen gas can be set to be in the range of 40 to 400 Pa. The concentration of the hydrogen gas is in the range of 0.3% to 31%.

The atmosphere may include only the inert gas not containing the hydrogen gas.

When the partial pressure of the hydrogen-containing material in terms of hydrogen gas is less than 40 Pa, the allowable range of the pulling speed is reduced and thus the generation of COP defects and dislocation clusters cannot be suppressed, which is not preferable. As the concentration of the hydrogen-containing material in terms of hydrogen gas (the concentration of hydrogen) increases, the dislocation suppressing effect increases. However, when the partial pressure in terms of hydrogen gas is greater than 400 Pa, the possibility of explosion increases at the time of causing oxygen to leak into the CZ furnace, which is not preferable in terms of safety. The partial pressure of the hydrogen-containing material in terms of hydrogen gas is more preferably in the range of 40 Pa to 250 Pa and still more preferably in the range of 40 Pa to 135 Pa.

The horizontal magnetic field of, for example, 3000 G (0.3 T) is supplied from the magnetic field supply device 9 so that the magnetic field center height is in the range of −75 to +50 mm with respect to the melt surface, and the polycrystalline silicon is heated by the heater 2 to form the silicon melt 3.

The seed crystal T mounted on the seed chuck 5 is immersed in the silicon melt 3 and the crystal pulling is performed while rotating the crucible 1 and the pulling shaft 4.

At this time, an example of the pulling condition is a condition that when the growing speed of the single crystal is V (mm/min) and the temperature gradient from the melting point to 1350° C. at the time of growth of the single crystal is G (° C./mm), the ratio V/G (mm²/min° C.) is controlled to be in the range of 0.22 to 0.15 and V is controlled to be in the mage of 0.65 via 0.42 to 0.33 mm/min at which the silicon single crystal with grown-in defects free can be pulled.

Another example of the pulling condition is a condition that the number of rotations of the quartz crucible is set to be in the range of 5 to 0.2 rpm, the number of rotations of the single crystal is set to be in the range of 20 to 10 rpm, the pressure of the argon atmosphere is set to 30 Torr, and the intensity of the magnetic field is set to 3000 Gauss. Particularly, by setting the number of rotations of the quartz crucible to 5 rpm or less, it is possible to prevent oxygen atoms included in the quartz crucible from diffusing into the silicon melt and to reduce the interstitial oxygen concentration in the silicon single crystal. Another example of the pulling condition is a condition that the number of rotations of the quartz crucible is set to 0.2 rpm or less, the number of rotations of the single crystal is set to 5 rpm or less, the pressure of the argon atmosphere is set to be in the range of 1333 to 26660 Pa, and the intensity of the magnetic field is set to be in the range of 3000 to 5000 Gauss. The number of rotations of the single crystal may be set to 15 rpm or more.

The manufacturing condition setting process S20 shown in FIG. 10 can be performed as follows.

In the manufacturing condition setting process S20, such conditions are selected that boron is doped so that the resistivity is in the range of 0.001 Ωcm to 1 kΩcm, the initial oxygen concentration Oi is set to be in the range of $12.0\times10^{17}$ to $20\times10^{17}$ atoms/cm$^3$ (Old-ASTM), and the silicon crystal includes a region in which the Pv region and the Pi region are distributed but does not include the OSF region. In the manufacturing condition setting process S20, as the conditions of the precipitation, dissolution, and thermal treatment process S23, the treatment temperature is set to be in the range of 950° C. to 1200° C., the retention time is set to be in the range of 5 sec to 1 min, the temperature-falling rate is set to be in the range of 10° C./sec to 0.1° C./sec, and the atmosphere is set to the atmosphere of non-oxidizing gas not containing nitrogen or the mixed atmosphere of non-oxidizing gas not containing nitrogen and oxygen gas of 3% or more. Preferably, the initial oxygen concentration Oi is set to be in the range of $13\times10^{17}$ to $18\times10^{17}$ atoms/cm$^3$. Preferably, the treatment temperature is set to be in the range of 1000° C. to 1175° C., the retention time is set to be in the range of 10 sec to 45 sec, the temperature-falling rate is set to be in the range of 8° C./sec to 0.5° C./sec, and the oxygen gas concentration is set to be in the range of 3.5% to 10%.

In the manufacturing condition setting process S20, such conditions are selected that boron is doped so that the resistivity is in the range of 0.001 Ωcm to 1 kΩcm, the initial oxygen concentration Oi is set to be in the range of $12.0\times10^{17}$ to $20\times10^{17}$ atoms/cm$^3$ (Old-ASTM), and the silicon crystal includes the Pv region, the Pi region, and the OSF region. In the manufacturing condition setting process S20, as the conditions of the precipitation, dissolution, and thermal treatment process S23, the treatment temperature is set to be in the range of 1225° C. to 1350° C., the retention time is set to be in the range of 5 sec to 1 min, the temperature-falling rate is set to be in the range of 10° C./sec to 0.1° C./sec, and the atmosphere is set to the atmosphere of non-oxidizing gas not containing nitrogen or the mixed atmosphere of non-oxidizing gas not containing nitrogen and oxygen gas of 3% or more. Preferably, the initial oxygen concentration Oi is set to be in the range of $12.5\times10^{17}$ to $18\times10^{17}$ atoms/cm$^3$. Preferably, the treatment temperature is set to be in the range of 1250° C. to 1325° C., the retention time is set to be in the range of 10 sec to 45 sec, the temperature-falling rate is set to be in the range of 8° C./sec to 0.5° C./sec, and the oxygen gas concentration is set to be in the range of 3.5% to 10%.

The precipitation, dissolution, and thermal treatment process S23 shown in FIG. 10 is performed under the above-mentioned conditions by the RTA apparatus 10. The RTA apparatus 10 is the RTA apparatus 10 shown in FIG. 2 in the first embodiment.

In the device manufacturing process S25 shown in FIG. 10, processes necessary for forming devices based on the 45 nm node (hp65) on the silicon wafer are performed. The device manufacturing process S25 includes the rapid temperature-rising-and-falling thermal treatment process S252 such as a spike-RTA process or an FLA process.

In the pre-photolithography process S251 and the post-photolithography process S253 shown in FIG. 10, as shown in FIG. 5, a wafer 21 is supported and fixed onto a work stage 22 by vacuum suction, a photomask 23 is supported and fixed onto a mask holder 24 above the work stage 22. Thereafter, the work stage 22 is lifted up to bring the thin wafer 21 into close contact with the photomask 23, and then the wafer is exposed. A photoresist film (not shown) is formed on the surface of the wafer 21 in advance and the photoresist film is exposed to bake a pattern of the photomask 23.

In the method of manufacturing a silicon wafer according to the second embodiment, in the manufacturing condition setting process S20, the pulling conditions in the wafer preparing process S211 and the treatment conditions in the precipitation, dissolution, and thermal treatment process S23 are determined in consideration of the conditions in the rapid temperature-rising-and-falling thermal treatment process S252. The processes are performed on the basis of the determined conditions. Therefore, in the silicon wafer W according to the second embodiment, precipitates with a density and a size greater than $5\times10^4$ pcs/cm$^2$ which causes the slip dislocation in the wafer are not formed. Accordingly, as shown in FIG. 5, even when the wafer 21 is supported and fixed onto the work stage 22 by vacuum suction, the maximum shift shown in FIG. 7 and resulting from the precipitates is not greater than 10 nm which is the allowable reference. That is, the deformation of a warp causing the overlay error shown in FIG. 6 is not generated.

In addition, in the silicon wafer according to the second embodiment, it is possible to prevent the slip dislocation from being generated in the edge of the wafer supported as shown in FIG. 8 and thus to prevent the strength of the wafer from being lowered.

When the spike-RTA process is performed as the rapid temperature-rising-and-falling thermal treatment process S252, the conditions can be set and the process can be performed by the use of the RTA apparatus 10 shown in FIG. 2.

Third Embodiment

Hereinafter, a silicon wafer and a manufacturing method thereof according to a third embodiment of the invention will be described with reference to the accompanying drawings.

Figure 12:
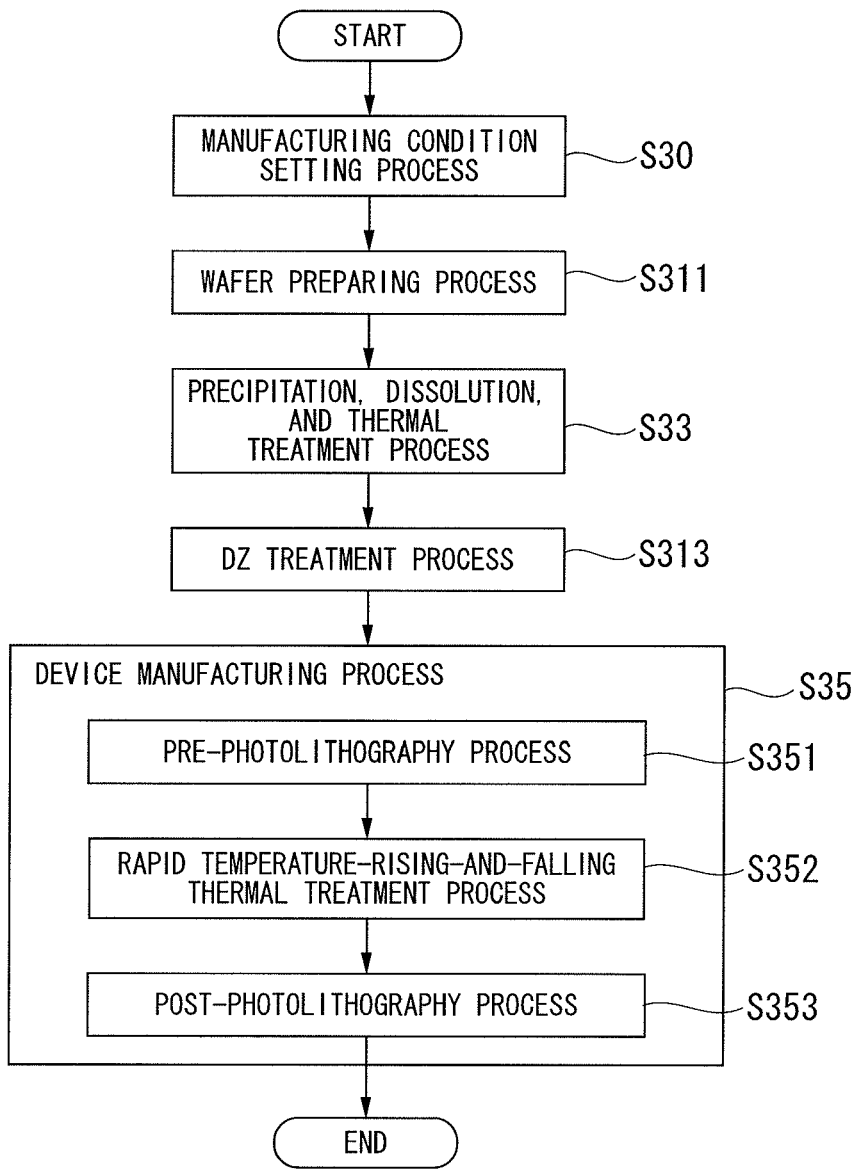
FIG. 12 is a flowchart illustrating a method of manufacturing a silicon wafer according to a third aspect of the invention.

FIG. 12 is a flowchart illustrating a manufacturing method of a silicon wafer according to this embodiment.

The method of manufacturing a silicon wafer according to this embodiment includes a manufacturing condition setting process S30, a wafer preparing process S311 including a pulling process, a precipitation, dissolution, and thermal treatment process S33, and a DZ treatment process S313, as shown in FIG. 12. The silicon wafer manufactured through the precipitation, dissolution, and thermal treatment process S33 is provided to a device manufacturing process S35 including a rapid temperature-rising-and-falling thermal treatment process S352.

In the manufacturing condition setting process S30 shown in FIG. 12, the standards of a wafer provided to the device manufacturing process S35, the conditions at the time of pulling a silicon single crystal from a silicon melt by the use of the CZ (Czochralski) method in the wafer preparing process S311, the conditions in the DZ treatment process S313, and the conditions in the precipitation, dissolution, and thermal treatment process S33 based on the above-mentioned conditions are set. A stress is generated in the wafer depending on the conditions in the rapid temperature-rising-and-falling thermal treatment process S352 such as an FLA process of the semiconductor device manufacturing process S35 which is a subsequent process provided with the wafer. To prevent the generation of the stress, there is an oxygen precipitation state required for coping with the stress. In the manufacturing condition setting process S30, the conditions in the precipitation, dissolution, and thermal treatment process S33 are determined to set the oxygen precipitation state to a desired state. In the device manufacturing process S35, the thermal treatment provided with the silicon wafer is the rapid temperature-rising-and-falling thermal treatment process S352 in which the treatment time is set to be in the range of 1 μsec to 100 msec in the highest temperature range of 1100° C. to the melting point of silicon. The conditions for suppressing the generation of a deformation and the generation of a slip in the rapid temperature-rising-and-falling thermal treatment process S352 are determined in the manufacturing condition setting process S30 so that a pattern formed in a pre-photolithography process S351 and a pattern formed in a post-photolithography process S353 before and after the rapid temperature-rising-and-falling thermal treatment process S352 are not misaligned to cause the overlay error.

In the manufacturing condition setting process S30, the ratio of the pulling speed V and the temperature gradient G from the solid-liquid interface serving as a parameter to be controlled at the time of pulling, that is, the value of V/G, the oxygen concentration Oi of a silicon wafer (substrate), and the dopant concentrations are set as process requirements in the wafer preparing process S311.

In the wafer preparing process S311, a single crystal is pulled by the use of the CZ method by the use of a CZ furnace, the pulled silicon single crystal ingot is sliced to form a wafer, and the wafer is subjected to surface treatment such as chamfering, grinding, polishing, and cleaning to prepare a silicon wafer. The diameter of the silicon wafer may be in the range of 300 mm to 450 mm.

The CZ furnace shown in FIG. 11 in the second embodiment is used to manufacture a silicon wafer in the wafer preparing process S311.

In the wafer preparing process S311, first, 100 kg of high-purity polycrystalline silicon is input to the crucible 1 shown in FIG. 11 and necessary dopants are also input thereto to adjust the dopant concentrations in the polycrystalline silicon.

Then, the inside of the CZ furnace is set to a predetermined atmosphere of inert gas or the like and the pressure thereof is adjusted.

The horizontal magnetic field of, for example, 3000 G (0.3 T) is supplied from the magnetic field supply device 9 so that the magnetic field center height is in the range of −75 to +50 mm with respect to the melt surface, and the polycrystalline silicon is heated by the heater 2 to form the silicon melt 3.

The seed crystal T mounted on the seed chuck 5 is immersed in the silicon melt 3 and the crystal pulling is performed while rotating the crucible 1 and the pulling shaft 4.

At this time, an example of the pulling condition is a condition that when the growing speed of the single crystal is V (mm/min) and the temperature gradient from the melting point to 1350° C. at the time of growth of the single crystal is G (° C./mm), the ratio V/G (mm²/min° C.) is controlled to be in the range of 0.22 to 0.15 and V is controlled to be in the range of 0.65 via 0.42 to 0.33 mm/min at which the silicon single crystal including the V region having the void defects present therein can be pulled.

Another example of the pulling condition is a condition that the number of rotations of the quartz crucible is set to be in the range of 5 to 0.2 rpm, the number of rotations of the single crystal is set to be in the range of 20 to 10 rpm, the pressure of the argon atmosphere is set to 30 Torr, and the intensity of the magnetic field is set to 3000 Gauss. The intensity of the magnetic field may be set to be in the range of 3000 to 5000 Gauss. The number of rotations of the single crystal may be set to 15 rpm or more.

The manufacturing condition setting process S30 shown in FIG. 12 can be performed as follows.

In the manufacturing condition setting process S30, as the conditions in the pulling process, boron is doped so that the resistivity is in the range of 0.001 Ωcm to 1 kΩcm, the initial oxygen concentration Oi is set to be in the range of $12.0 \times 10^{17}$ to $18 \times 10^{17}$ atoms/cm³ (Old-ASTM), and the pulling speed is set to cause the void defects to be present. As the conditions in the DZ treatment process S313, the atmosphere is set to a non-oxidizing atmosphere including $H_2$ or Ar, the treatment temperature is set to be in the range of 1150° C. to 1300° C., and the treatment time is set to be in the range of 30 min to 16 hours. As the conditions in the precipitation, dissolution, and thermal treatment process S33, the treatment temperature is set to be in the range of 950° C. to 1200° C., the retention time is set to be in the range of 5 sec to 1 min, the temperature-falling rate is set to be in the range of 10° C./sec to 0.1° C./sec, and the atmosphere is set to the atmosphere of non-oxidizing gas not containing nitrogen or the mixed atmosphere of non-oxidizing gas not containing nitrogen and oxygen gas of 1% or more. At this time, the initial oxygen concentration Oi is preferably in the range of $12.5 \times 10^{17}$ to $17 \times 10^{17}$ atoms/cm³. Preferably, the treatment temperature of the DZ treatment process is set to be in the range of 1175° C. to 1275° C. and the treatment time thereof is set to be in the range of 40 min to 8 hours. Preferably, the treatment temperature of the precipitation, dissolution, and thermal treatment process S33 is set to be in the range of 1000° C. to 1175° C., the retention time thereof is set to be in the range of 10 sec to 45 sec, the temperature-falling rate is set to be in the range of 8° C./sec to 0.5° C./sec, and the oxygen gas concentration is set to be in the range of 1.5% to 10%.

In the manufacturing condition setting process S30, as the conditions in the pulling process, boron is doped so that the resistivity is in the range of 0.001 Ωcm to 1 kΩcm, the initial oxygen concentration Oi is set to be in the range of $12.0 \times 10^{17}$ to $18 \times 10^{17}$ atoms/cm³ (Old-ASTM), and the pulling speed is set to cause the void defects to be present. As the conditions in the DZ treatment process S313, the atmosphere is set to a non-oxidizing atmosphere including $H_2$ or Ar, the treatment temperature is set to be in the range of 1150° C. to 1300° C., and the treatment time is set to be in the range of 30 min to 16 hours. As the conditions in the precipitation, dissolution, and thermal treatment process S33, the treatment temperature is set to be in the range of 1225° C. to 1350° C., the retention time is set to be in the range of 5 sec to 1 min, the temperature-falling rate is set to be in the range of 10° C./sec to 0.1° C./sec, and the atmosphere is set to the atmosphere of non-oxidizing gas not containing nitrogen or the mixed atmosphere of non-oxidizing gas not containing 1% or more of nitrogen and oxygen gas. At this time, the initial oxygen concentration Oi is preferably in the range of $12.5 \times 10^{17}$ to $17 \times 10^{17}$ atoms/cm³. Preferably, the treatment temperature of the DZ treatment process is set to be in the range of 1175° C. to 1275° C. and the treatment time thereof is set to be in the range of 40 min to 8 hours. Preferably, the treatment temperature of the precipitation, dissolution, and thermal treatment process S33 is set to be in the range of 1250° C. to 1300° C., the retention time thereof is set to be in the range of 5 sec to 30 sec, the temperature-falling rate is set to be in the range of 8° C./sec to 0.5° C./sec, and the oxygen gas concentration is set to be in the range of 1.5% to 10%.

The precipitation, dissolution, and thermal treatment process S33 shown in FIG. 12 is performed as the pre-process of the DZ treatment process S313 under the above-mentioned conditions by the RTA apparatus 10. The RTA apparatus 10 is the RTA apparatus 10 shown in FIG. 2 in the first embodiment.

The DZ treatment process S313 shown in FIG. 12 is performed, for example, by a vertical batch furnace. In the DZ treatment process S313, by performing a high-temperature annealing process on the wafer subjected to the precipitation, dissolution, and thermal treatment process S33 in the non-oxidizing atmosphere of $H_2$ or Ar at 1150° C. or higher for 30 min or more, the void defects in the surface of the wafer which is a device forming area are eliminated.

When the silicon wafer having been subjected to the DZ treatment process S313 is subjected to thermal treatment at 1000° C. for 16 hours, the BMD (oxygen precipitates) density is equal to or less than $1 \times 10^4$ pcs/cm$^2$.

In the device manufacturing process S35 shown in FIG. 12, processes necessary for forming devices based on the 45 nm node (hp65) on the silicon wafer are performed. The device manufacturing process S35 includes the rapid temperature-rising-and-falling thermal treatment process S352 such as a spike-RTA process or an FLA process.

In the pre-photolithography process S351 and the post-photolithography process S353 shown in FIG. 12, as shown in FIG. 5, a wafer 21 is supported and fixed onto a work stage 22 by vacuum suction, a photomask 23 is supported and fixed onto a mask holder 24 above the work stage 22. Thereafter, the work stage 22 is lifted up to bring the thin wafer 21 into close contact with the photomask 23, and then the wafer is exposed. A photoresist film (not shown) is formed on the surface of the wafer 21 in advance and the photoresist film is exposed to bake a pattern of the photomask 23.

In the method of manufacturing a silicon wafer according to the third embodiment, in the manufacturing condition setting process S30, the pulling conditions in the wafer preparing process S311, the treatment conditions in the precipitation, dissolution, and thermal treatment process S33, and the treatment conditions in the DZ treatment process S313 are determined in consideration of the conditions in the rapid temperature-rising-and-falling thermal treatment process S352. The processes are performed on the basis of the determined conditions. Therefore, in the silicon wafer according to the third embodiment, precipitates with a density and a size greater than $5 \times 10^4$ pcs/cm$^2$ which causes the slip dislocation in the wafer are not formed. Accordingly, as shown in FIG. 5, even when the wafer 21 is supported and fixed onto the work stage 22 by vacuum suction, the maximum shift shown in FIG. 7 and resulting from the precipitates is not greater than 10 nm which is the allowable reference. That is, the deformation of a warp causing the overlay error shown in FIG. 6 is not generated.

In addition, in the silicon wafer according to the third embodiment, it is possible to prevent the slip dislocation from being generated in the edge of the wafer W supported as shown in FIG. 8 and thus to prevent the strength of the wafer from being lowered.

When the spike-RTA process is performed as the rapid temperature-rising-and-falling thermal treatment process S352, the conditions can be set and the process can be performed by the use of the RTA apparatus 10 shown in FIG. 2.

Fourth Embodiment

Hereinafter, a silicon wafer and a manufacturing method thereof according to a fourth embodiment of the invention will be described with reference to the accompanying drawings.

Figure 13:
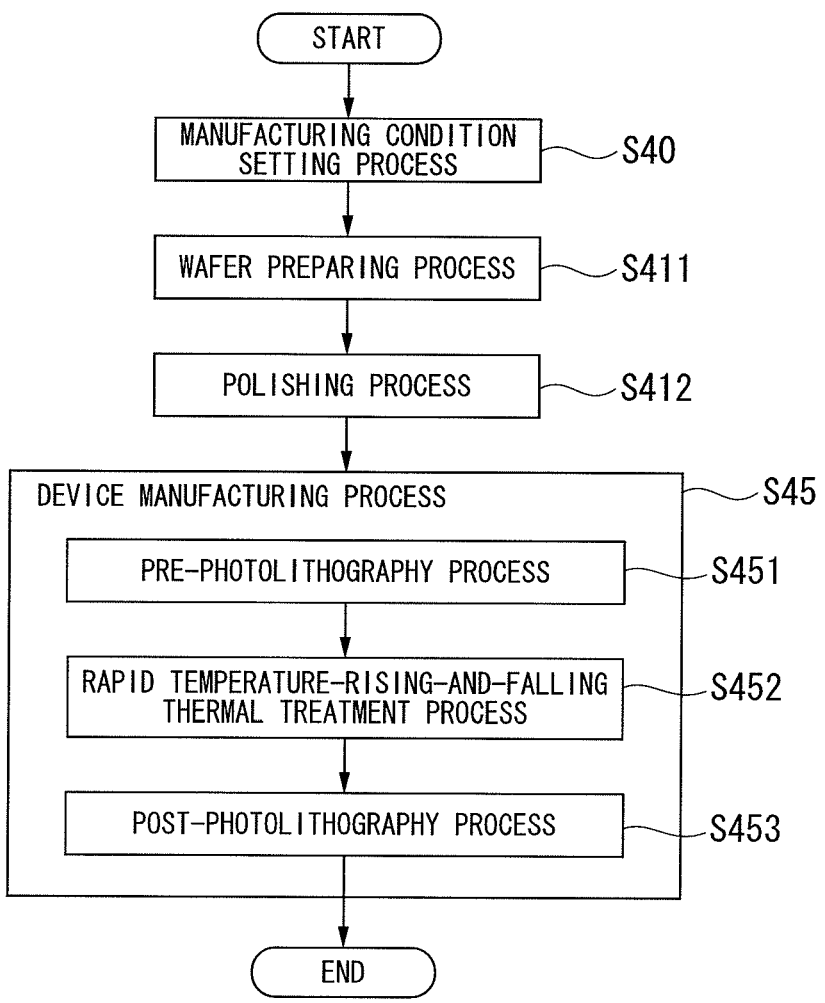
FIG. 13 is a flowchart illustrating a method of manufacturing a silicon wafer according to a fourth aspect of the invention.

FIG. 13 is a flowchart illustrating and a manufacturing method of a silicon wafer according to this embodiment.

The method of manufacturing a silicon wafer according to the fourth embodiment includes a manufacturing condition setting process S40, a wafer preparing process S411, and a polishing process S412, as shown in FIG. 13. The silicon wafer manufactured by the method according to the fourth embodiment is provided to a device manufacturing process S45 including a rapid temperature-rising-and-falling thermal treatment process S452.

In the manufacturing condition setting process S40 shown in FIG. 13, the standards of a wafer provided to the device manufacturing process S45 and the conditions at the time of pulling a silicon single crystal from a silicon melt by the use of the CZ (Czochralski) method in the wafer preparing process S411 are set.

In the manufacturing condition setting process S40, the ratio of the pulling speed V and the temperature gradient G from the solid-liquid interface serving as a parameter to be controlled at the time of pulling, that is, the value of V/Q the oxygen concentration Oi of a silicon wafer (substrate), and the dopant concentrations are set as process requirements in the wafer preparing process S411.

In the wafer preparing process S411, a single crystal is pulled by the use of the CZ method by the use of a CZ furnace, the pulled silicon single crystal ingot is sliced to form a wafer, and the wafer is subjected to surface treatment such as chamfering, grinding, and cleaning. Thereafter, the silicon wafer is provided to the polishing process S412 as a finishing process. The diameter of the silicon wafer may be in the range of 300 mm to 450 mm.

The CZ furnace shown in FIG. 11 in the second embodiment is used to manufacture a silicon wafer in the wafer preparing process S411.

In the wafer preparing process S411, first, 100 kg of high-purity polycrystalline silicon is input to the crucible 1 shown in FIG. 11 and necessary dopants are also input thereto to adjust the dopant concentrations in the polycrystalline silicon. Then, the inside of the CZ furnace is set to a hydrogen-containing atmosphere including mixed gas of a hydrogen-containing material and inert gas, the pressure of the atmosphere is set to be in the range of 1.3 to 13.3 kPa (10 to 100 Torr), and the concentration of the hydrogen-containing material in the atmosphere gas is adjusted so that the partial pressure thereof in terms of hydrogen gas is in the range of 40 to 400 Pa. When hydrogen gas is selected as the hydrogen-containing material, the partial pressure of the hydrogen gas can be set to be in the range of 40 to 400 Pa. The concentration of the hydrogen gas is in the range of 0.3% to 31%.

The atmosphere may include only the inert gas not containing the hydrogen gas.

When the partial pressure of the hydrogen-containing material in terms of hydrogen gas is less than 40 Pa, the allowable range of the pulling speed is reduced and thus the generation of COP defects and dislocation clusters cannot be suppressed, which is not preferable. As the concentration of the hydrogen-containing material in terms of hydrogen gas (the concentration of hydrogen) increases, the dislocation suppressing effect increases. However, when the partial pressure in terms of hydrogen gas is greater than 400 Pa, the possibility of explosion increases at the time of causing oxygen to leak into the CZ furnace, which is not preferable in terms of safety. The partial pressure of the hydrogen-containing material in terms of hydrogen gas is more preferably in the range of 40 Pa to 250 Pa and still more preferably in the range of 40 Pa to 135 Pa.

The horizontal magnetic field of, for example, 3000 G (0.3 T) is supplied from the magnetic field supply device 9 so that the magnetic field center height is in the range of −75 to +50 mm with respect to the melt surface, and the polycrystalline silicon is heated by the heater 2 to form the silicon melt 3.

The seed crystal T mounted on the seed chuck 5 is immersed in the silicon melt 3 and the crystal pulling is performed while rotating the crucible 1 and the pulling shaft 4.

At this time, an example of the pulling condition is a condition that when the growing speed of the single crystal is V (mm/min) and the temperature gradient from the melting point to 1350° C. at the time of growth of the single crystal is G (° C./mm), the ratio V/G (mm$^2$/min° C.) is controlled to be in the range of 0.22 to 0.15 and V is controlled to be in the range of 0.65 via 0.42 to 0.33 mm/min at which the silicon single crystal with grown-in defects free can be pulled.

Another example of the pulling condition is a condition that the number of rotations of the quartz crucible is set to be in the range of 5 to 0.2 rpm, the number of rotations of the single crystal is set to be in the range of 20 to 10 rpm, the pressure of the argon atmosphere is set to 30 Torr, and the intensity of the magnetic field is set to 3000 Gauss. Particularly, by setting the number of rotations of the quartz crucible to 5 rpm or less, it is possible to prevent oxygen atoms included in the quartz crucible from diffusing into the silicon melt and to reduce the interstitial oxygen concentration in the silicon single crystal. Another example of the pulling condition is a condition that the number of rotations of the quartz crucible is set to 0.2 rpm or less, the number of rotations of the single crystal is set to 5 rpm or less, the pressure of the argon atmosphere is set to be in the range of 1333 to 26660 Pa, and the intensity of the magnetic field is set to be in the range of 3000 to 5000 Gauss. The number of rotations of the single crystal may be set to 15 rpm or more.

The semiconductor device manufacturing process S45 is a subsequent process to which the silicon wafer prepared in the wafer preparing process S411 is provided. A stress is generated in the wafer depending on the conditions in the rapid temperature-rising-and-falling thermal treatment process S452 such as an FLA process of the semiconductor device manufacturing process S45. There is an oxygen precipitation state required for coping with the stress. In the manufacturing condition setting process S40 shown in FIG. 13, the conditions in the wafer preparing process S411 are determined to set the oxygen precipitation state to a desired state. In the device manufacturing process S45, the thermal treatment provided with the silicon wafer is the rapid temperature-rising-and-falling thermal treatment process S452 in which the treatment time is set to be in the range of 1 μsec to 100 msec in the highest temperature range of 1100° C. to the melting point of silicon. The conditions for suppressing the generation of a deformation and the generation of a slip in the wafer preparing process S411 (the pulling condition of the CZ method) are determined in the manufacturing condition setting process S40 so that a pattern formed in a pre-photolithography process S451 and a pattern formed in a post-photolithography process S453 before and after the rapid temperature-rising-and-falling thermal treatment process S452 are not misaligned to cause the overlay error.

The conditions in the manufacturing condition setting process S40 can be selected as follows.

In the manufacturing condition setting process S40, boron is doped so that the resistivity is in the range of 0.001 Ωcm to 1 kΩcm and the initial oxygen concentration Oi is set to be in the range of 12.0×10$^{17}$ to 14×10$^{17}$ atoms/cm$^3$ (Old-ASTM). At this time, the initial oxygen concentration Oi is preferably set to be in the range of 12.3×10$^{17}$ to 13.8×10$^{17}$ atoms/cm$^3$.

In the device manufacturing process S45 shown in FIG. 13, processes necessary for forming devices based on the 45 nm node (hp65) on the silicon wafer are performed. The device manufacturing process S45 includes the rapid temperature-rising-and-falling thermal treatment process S452 such as a spike-RTA process or an FLA process.

In the pre-photolithography process S451 and the post-photolithography process S453 shown in FIG. 13, as shown in FIG. 5, a wafer 21 is supported and fixed onto a work stage 22 by vacuum suction, a photomask 23 is supported and fixed onto a mask holder 24 above the work stage 22. Thereafter, the work stage 22 is lifted up to bring the thin wafer 21 into close contact with the photomask 23, and then the wafer is exposed. A photoresist film (not shown) is formed on the surface of the wafer 21 in advance and the photoresist film is exposed to bake a pattern of the photomask 23.

In the method of manufacturing a silicon wafer according to this embodiment, in the manufacturing condition setting process S40, the pulling conditions in the wafer preparing process S411 are determined in consideration of the conditions in the rapid temperature-rising-and-falling thermal treatment process S452. The processes are performed on the basis of the determined conditions. Therefore, the silicon wafer according to the fourth embodiment is a wafer including the Pi region in which the oxygen precipitate density is 1×10$^4$ pcs/cm$^2$ or less after the thermal treatment at 800° C. for 4 hours+1000° C. for 16 hours. That is, precipitates with a density and a size greater than 5×10$^4$ pcs/cm$^2$ which causes the slip dislocation in the wafer are not formed. Accordingly, as shown in FIG. 5, even when the wafer 21 is supported and fixed onto the work stage 22 by vacuum suction, the maximum shift shown in FIG. 7 and resulting from the precipitates is not greater than 10 nm which is the allowable reference. That is, the deformation of a warp causing the overlay error shown in FIG. 6 is not generated.

In addition, in the silicon wafer according to the fourth embodiment, it is possible to prevent the slip dislocation from being generated in the edge of the wafer W supported as shown in FIG. 8 and thus to prevent the strength of the wafer from being lowered.

When the spike-RTA process is performed as the rapid temperature-rising-and-falling thermal treatment process S452, the conditions can be set and the process can be performed by the use of the RTA apparatus 10 shown in FIG. 2. The RTA apparatus 10 is the RTA apparatus 10 shown in FIG. 2 in the first embodiment.

Figure 9:
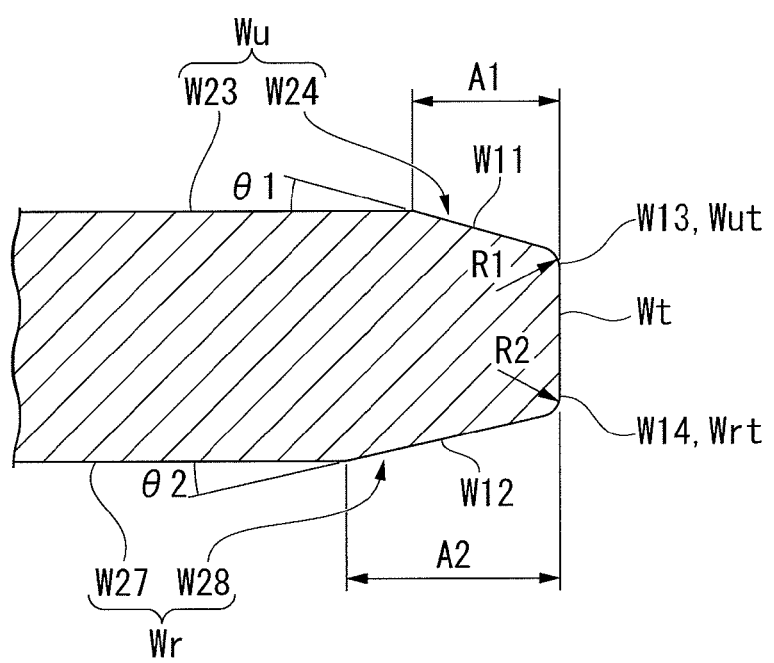
FIG. 9 is an enlarged sectional view illustrating an edge of a silicon wafer according to the invention.

In the first to fourth embodiments, as shown in FIG. 9, the front surface Wu of a wafer includes a main surface W23 which is a flat surface and a front chamfered portion W24 formed in the edge portion thereof. The back surface Wr thereof includes a main surface W27 which is a flat surface and a back chamfered portion W28 formed in the edge portion thereof. The width A1 of the front chamfered portion W24 in the direction from the edge Wut to the inside in the wafer radius direction is smaller than the width A2 of the back chamfered portion W28 in the direction from the edge Wrt to the inside in the wafer radius direction. The width A1 of the front chamfered portion W24 is preferably in the range of 50 μm to 200 μm. The width A2 of the back chamfered portion W28 is preferably in the range of 200 μm to 300 μm.

The front chamfered portion W24 has a first slope W11 tilted about the main surface W23 of the front surface Wu and the back chamfered portion W28 has a second slope W12 tilted about the main surface W27 of the back surface Wr. The slope angle θ1 of the first slope W11 is preferably in the range of 10° to 50°, the slope angle θ2 of the second slope W12 is preferably in the range of 10° to 30°, and both angles preferably satisfy θ1≤θ2.

A first curve W13 connecting the first slope W11 and the peripheral edge Wt is disposed in the front outermost edge Wut therebetween. A second curve W14 connecting the second slope W12 and the peripheral edge Wt is disposed in the back outermost edge Wrt therebetween. The radius of curvature R1 of the first curve W13 is preferably in the range of 80 μm to 250 μm, and the radius of curvature R2 of the second curve W14 is preferably in the range of 100 μm to 300 μm.

By constructing the end portions as described above, it is possible to reduce the generation of scratches at the time of handling the wafer. In the first to fourth embodiments of the invention, by setting the conditions of the wafer edge as well as the treatment conditions in the rapid temperature-rising-and-falling thermal treatment process, it is possible to further prevent the generation of a deformation in the rapid temperature-rising-and-falling thermal treatment process of which the conditions are severe.

EXAMPLES

Hereinafter, examples of the invention will be described.

Experimental Example A (100) wafers were prepared from a silicon single crystal ingot with a diameter of 300 mm, which was pulled by setting the boron concentration (resistivity), the initial oxygen concentration, the nitrogen concentration, and the like as described in Tables 1 to 3, by the slicing and double-sided polishing (DSP) processes.

The conditions in the precipitation, dissolution, and thermal treatment process S13 were set as described in Tables 1 to 3, the RTA process was performed on the prepared silicon wafers, and an epitaxial film with a thickness of 4 μm was formed thereon through the epitaxial process at 1150° C.

The thermal treatment in the device manufacturing process was simulated with the following conditions and the RTA thermal treatment as a compulsory thermal-stress test for generation of a deformation was performed on the wafers.

The generation of slips due to the oxygen precipitates (BMD) was checked by the use of X-ray topography.

<Simulation Conditions in Device Manufacturing Process>
First step: 850° C., 30 minutes
Second step: 1000° C., 30 minutes
Third step: 1000° C., 60 minutes
Fourth step: 850° C., 30 minutes
(The temperature rising and falling rate of each step is 5° C./min)

<Conditions of Thermal-stress Loading Test in RTA Furnace>

The temperature rising and falling rate from 700° C. was set to 150° C./sec, the highest temperature was set to 1250° C., and the retention time was set to 1 sec.

The results were shown as RTA furnace stress loading test results (generation of slips due to the BMD) in Tables 1 to 3.

Here, the BMD density was measured when the actualizing thermal treatment at 1000° C. for 16 hours was first performed and the Wright etching (of which the etching range is 2 μm) was then performed after the device simulation.

After the thermal treatment was performed by the use of a batch furnace under the following conditions as a stress loading test for the generation of scratches, the slip length was measured by the use of X-ray topography. The results were shown as vertical furnace stress loading test results (slip due to boat scratches) in Tables 1 to 3.

<Vertical Furnace Thermal-stress Test Conditions>

The temperature rising and falling rate from 700° C. to 1150° C. was set to 8° C./min, the samples were retained at 1150° C. for 60 minutes, and then the samples were cooled to 700° C. at a temperature falling rate of 1.5° C./min.

TABLE 1

| | | Initial oxygen concentration (×E17 atoms/cc) | RTA process | | | | | BMD density (/cm$^2$) after Epi growth | RTA furnace stress loading test result (slips due to BMD) | Vertical furnace stress loading test result (slips due to boat) |
|---|---|---|---|---|---|---|---|---|---|---|
| | Resistivity (Ωcm) | | Temperature (° C.) | Time (sec) | Temperature-falling rate (° C./sec) | Atmosphere | | | | |
| Sample A1 | 5 | 13.2 | — | — | — | — | <1e4 | ○ | X |
| Sample A2 | 0.018 | 12 | — | — | — | — | 7.80E + 04 | X (BMD) | Δ |
| Sample A3 | 0.018 | 14.8 | — | — | — | — | 3.80E + 05 | X (BMD) | Δ |
| Sample A4 | 0.004 | 14.5 | — | — | — | — | 1.70E + 06 | X (BMD) | ○ |
| Sample A5 | 0.018 | 10.5 | — | — | — | — | <1e4 | ○ | Δ |
| Sample A6 | 0.003 | 9.5 | — | — | — | — | <1e4 | ○ | ○ |
| Sample A7 | 0.019 | 11.8 | 1150 | 10 | 10 | 100% Ar | <1e4 | ○ | Δ |
| Sample A8 | 0.005 | 15.1 | 1150 | 20 | 10 | 100% Ar | <1e4 | ○ | ○ |
| Sample A9 | 0.008 | 17.8 | 1200 | 10 | 10 | 100% Ar | <1e4 | ○ | ○ |
| Sample A10 | 0.005 | 17.1 | 1300 | 10 | 5 | 100% Ar | <1e4 | ○ | ○ |
| Sample A11 | 0.008 | 15.1 | 1125 | 20 | 10 | 100% Ar | 4.60E + 05 | X (BMD) | ○ |
| Sample A12 | 0.004 | 14.5 | 1150 | 10 | 20 | 100% Ar | 4.80E + 04 | X (BMD) | ○ |

TABLE 2

| | Resistivity (Ωcm) | Initial oxygen concentration (×E17 atoms/cc) | Temperature (° C.) | Retention time (sec) | Temperature-falling rate (° C./sec) (cooling rate from highest temperature to 700° C.) | Atmosphere | BMD density (/cm$^2$) after Epi growth | RTA furnace stress loading test result (slips due to BMD) | Vertical furnace stress loading test result (slips due to boat) |
|---|---|---|---|---|---|---|---|---|---|
| Sample A13 | 5 | 15.5 | — | — | — | — | 4.50E + 04 | X (BMD) | ○ |
| Sample A14 | 4.7 | 15.5 | 1150 | 10 | 10 | 100% Ar | <1e4 | ○ | ○ |
| Sample A15 | 4.2 | 18.5 | 1200 | 10 | 10 | 100% Ar | <1e4 | ○ | ○ |

TABLE 2-continued

| | Resistivity (Ωcm) | Initial oxygen concentration (×E17 atoms/cc) | Temperature (° C.) | Retention time (sec) | Temperature-falling rate (° C./sec) (cooling rate from highest temperature to 700° C.) | Atmosphere | BMD density (/cm$^2$) after Epi growth | RTA furnace stress loading test result (slips due to BMD) | Vertical furnace stress loading test result (slips due to boat) |
|---|---|---|---|---|---|---|---|---|---|
| Sample A16 | 3.6 | 21.5 | 1300 | 5 | 10 | 100% Ar | <1e4 | ○ | ○ |
| Sample A17 | 3.7 | 22.4 | 1300 | 5 | 10 | 100% Ar | 2.30E + 05 | X (BMD) | ○ |
| Sample A18 | 3.6 | 18.5 | 1200 | 10 | 15 | 100% Ar | 1.60E + 06 | X (BMD) | ○ |
| Sample A19 | 3.2 | 17.5 | 1200 | 3 | 10 | 100% Ar | 7.50E + 05 | X (BMD) | ○ |
| Sample A20 | 3.5 | 17.1 | 1200 | 10 | 10 | 95% Ar + 5% N$_2$ | 6.80E + 04 | X (BMD) | ○ |
| Sample A21 | 20.5 | 15.3 | 1200 | 10 | 10 | 97% Ar + 3% O$_2$ | <1e4 | ○ | ○ |
| Sample A22 | 20.1 | 15.5 | 1200 | 10 | 25 | 97% Ar + 3% O$_2$ | <1e4 | ○ | ○ |
| Sample A23 | 18.5 | 14.3 | 1200 | 10 | 50 | 90% Ar + 3% O$_2$ | <1e4 | ○ | ○ |
| Sample A24 | 18.3 | 14.7 | 120 | 10 | 75 | 90% Ar + 10% O$_2$ | 4.30E + 04 | X (BMD) | ○ |

TABLE 3

Nitrogen-doped Epi

| | Resistivity (Ωcm) | Initial oxygen concentration (×E17 atoms/cc) | Nitrogen concentration (×E13 atoms/cc) | Temperature (° C.) | Time (sec) | Temperature-falling rate (° C./sec) | Atmosphere | BMD density (/cm$^2$) after Epi growth | RTA furnace stress loading test result (slips due to BMD) | Vertical furnace stress loading test result (slips due to boat) |
|---|---|---|---|---|---|---|---|---|---|---|
| Sample A25 | 5 | 12.5 | 2.30 | — | — | — | — | 7.50E + 04 | X (BMD) | ○ |
| Sample A26 | 4.3 | 12.6 | 5.60 | 1150 | 10 | 10 | 100% Ar | 3.50E + 04 | X (BMD) | ○ |
| Sample A27 | 3.5 | 11.6 | 3.50 | 1200 | 10 | 10 | 100% Ar | <1e4 | ○ | ○ |
| Sample A28 | 3.8 | 14.1 | 8.60 | 1200 | 5 | 10 | 100% Ar | <1e4 | ○ | ○ |
| Sample A29 | 4.6 | 14.5 | 33.00 | 1200 | 10 | 10 | 100% Ar | <1e4 | ○ | ○ |
| Sample A30 | 3.6 | 13.7 | 42.50 | 1300 | 5 | 10 | 100% Ar | <1e4 | ○ | ○ |

Here, the results of the slips or the slip lengths measured by the use of X-ray topography were defined as follows.

The RTA furnace thermal-stress loading test results were evaluated as follows.

O (A: Good): The generation of minute slips could not be confirmed by the use of X-ray topography.

X (B: Not Acceptable): The generation of minute slips could be confirmed by the use of X-ray topography.

Since the RTA process was performed for a short time, the slip length was minute and it was thus difficult to measure the slip length.

On the other hand, in the vertical furnace thermal-stress loading test, the lengths of slips extending from boat scratches were measured and were evaluated as follows.

O: slip length of 0.5 to 2 mm (A: Good)

Δ: slip length of 2 to 5 mm (B: Acceptable)

X: slip length of 5 to 10 mm (C: Not Acceptable)

In the BMD density (pcs/cm$^2$) after the epitaxial growth, <1e4 meant that it was equal to or less than an actual detection limit.

In Sample A1, since the formation of oxygen precipitation nuclei was kept at a low level even after the epitaxial growth, precipitates were not formed in the Epi growth+precipitation processes. Accordingly, there was no slip due to the BMD. However, since the oxygen concentration was low in the vertical furnace test, slips due to boat scratches extend, which is evaluated as NG.

In Sample A2, since the oxygen concentration was low but the boron concentration was high, precipitation nuclei were formed in the thermal treatment after the Epi. Since the boron concentration was high, the generation of slips due to boat scratches was suppressed but slips due to the BMD were generated, which is evaluated as NG.

In Sample A3, since the oxygen concentration was high and the boron concentration was high, slips due to BMD were generated and the generation of slips due to boat scratches was suppressed, which is evaluated as NG.

In Sample A4, since the oxygen concentration was high and the boron concentration was high, slips due to BMD were generated and the generation of slips due to boat scratches was much suppressed, which is evaluated as NG.

In Sample A5, the precipitation after the Epi was suppressed due to the low oxygen concentration. The generation of slips in the vertical furnace was suppressed due to the effect of boron, which is evaluated as OK.

In Sample A6, the precipitation after the Epi was suppressed due to the low oxygen concentration. The generation of slips in the vertical furnace was suppressed due to the effect of the high-concentration boron, which is evaluated as OK.

In Sample A7, the formation of BMD in the RTA process was suppressed, which is evaluated as OK.

In Sample A8, the formation of BMD in the RTA process was suppressed, which is evaluated as OK.

In Sample A9, the formation of BMD in the RTA process was suppressed, which is evaluated as OK.

In Sample A10, the formation of BMD in the RTA process was suppressed, which is evaluated as OK.

In Sample A11, the RTA temperature was equal to or less than 1150° C. and slips due to BMD were generated, which is evaluated as NG.

In Sample A12, vacancies were frozen by the rapid cooling in the RTA process to form BMD and slips due to BMD were generated, which is evaluated as NG.

In Sample A13, since the oxygen concentration was high and oxygen precipitation nuclei were easily formed even after the Epi growth, slips due to BMD were generated. Since the oxygen concentration was high, slips due to boat scratches were suppressed, which is evaluated as NG.

In Sample A14, since no BMD was present and the substrate had a high oxygen concentration, slips due to boat scratches were not present, which is evaluated as OK.

In Sample A15, since no BMD was present and the substrate had a high oxygen concentration, slips due to boat scratches were not present, which is evaluated as OK.

In Sample A16, since no BMD was present and the substrate had a high oxygen concentration, slips due to boat scratches were not present, which is evaluated as OK.

In Sample A17, since the oxygen concentration was high, the formation of BMD was promoted even after the RTA process and slips due to BMD were generated, which is evaluated as NG.

In Sample A18, since the cooling rate was excessively high and vacancies were frozen, slips due to BMD were generated, which is evaluated as NG.

In Sample A19, since the RTA process time was insufficient, slips due to BMD were generated from BMD nuclei, which is evaluated as NG.

In Sample A20, since vacancies were injected due to the formation of a nitride film out of nitrogen and oxygen precipitates were formed, slips due to BMD were generated, which is evaluated as NG.

In Sample A21, since no BMD was present and the substrate had a high oxygen concentration, slips due to boat scratches were not present, which is evaluated as OK.

In Sample A22, interstitial Si was injected due to the formation of an oxide film in the RTA process and vacancies were not frozen even by the cooling at 10° C./sec or higher, which is evaluated as OK.

In Sample A23, interstitial Si was injected due to the formation of an oxide film in the RTA process and vacancies were not frozen even by the cooling at 10° C./sec or higher, which is evaluated as OK.

In Sample A24, since an oxide film was formed but the cooling rate was excessively high and vacancies were frozen, slips due to BMD were generated, which is evaluated as NG.

In Sample A25, BMD was formed by the nitrogen-doping effect, which is evaluated as NG.

In Sample A26, since BMD in a nitrogen-doped epitaxial wafer was stabilized at a high temperature, the BMD was not eliminated in the RTA at 1150° C., which is evaluated as NG.

In Samples A27 to A30, BMD was eliminated by the doping with nitrogen regardless of the concentration. Since the substrate had a high oxygen concentration, slips due to boat scratches were not present, which is evaluated as OK.

It can be seen from these results that it is possible to prevent the deformation and the slip extension by setting the oxygen concentration, the boron concentration, and the conditions in the RTA process.

Experimental Example B (100) wafers were prepared from a silicon single crystal ingot with a diameter of 300 mm, which was pulled by setting the boron concentration (resistivity) to 10 Ωcm and setting the initial oxygen concentration, the nitrogen concentration and the like as described in Table 4, by the slicing and double-sided polishing (DSP) processes. At this time, the distribution of the Pi and Pv regions and the values of V/G were shown in the table.

The conditions in the precipitation, dissolution, and thermal treatment process S23 were set as described in Table 4, the RTA process was performed on the prepared silicon wafers.

The thermal treatment in the device manufacturing process was simulated with the following conditions and the RTA thermal treatment as a compulsory thermal-stress test for generation of a deformation was performed on the wafers. The generation of slips due to the oxygen precipitates (BMD) was checked by the use of X-ray topography.

<Simulation Conditions in Device Manufacturing Process>
First step: 850° C., 30 minutes
Second step: 1000° C., 30 minutes
Third step: 1000° C., 60 minutes
Fourth step: 850° C., 30 minutes
(The temperature rising and falling rate of each step is 5° C./min)

The results were shown as RTA furnace stress loading test results (generation of slips due to the BMD) in Table 4.

Here, the BMD density was measured when the actualizing thermal treatment at 1000° C. for 16 hours was first performed and the Wright etching (of which the etching range is 2 μm) was then performed after the device simulation.

After the thermal treatment was performed by the use of a batch furnace under the following conditions as a stress loading test for the generation of scratches, the slip length was measured by the use of X-ray topography. The results were shown as vertical furnace stress loading test results (slip due to boat scratches) in Table 4.

<Vertical Furnace Thermal-Stress Test Conditions>
The temperature rising and falling rate from 700° C. to 1150° C. was set to 8° C./min, the samples were retained at 1150° C. for 60 minutes, and then the samples were cooled to 700° C. at a temperature falling rate of 1.5° C./min.

TABLE 4

| | Initial oxygen concentration (×E17 atoms/cc) | In-plane V/G value of wafer defect region | RTA condition | | | | After thermal simulation of device | |
|---|---|---|---|---|---|---|---|---|
| | | | Temperature (°C.) | Time (sec) | atmosphere | Cooling rate (°C./sec) | RTA furnace stress loading test result (slips due to BMD) | Vertical furnace stress loading test result (slips due to boat) |
| Sample B1 | 12.4 | Pv + Pi (0.21~0.15) | — | — | — | — | X | ○ |
| Sample B2 | 12.2 | Pi (0.18~0.15) | — | — | — | — | ○ | ○ |
| Sample B3 | 13.8 | Pi (0.18~0.15) | — | — | — | — | ○ | ○ |
| Sample B4 | 14.2 | Pi (0.18~0.15) | — | — | — | — | X | ○ |
| Sample B5 | 12.2 | Pv + Pi (0.21~0.15) | 950 | 10 | 100% Ar | 5 | ○ | ○ |
| Sample B6 | 13 | Pv + Pi (0.21~0.15) | 1150 | 5 | 100% Ar | 10 | ○ | ○ |
| Sample B7 | 13.6 | Pv + Pi (0.21~0.15) | 1150 | 5 | 100% Ar + 5% O$_2$ | 10 | ○ | ○ |
| Sample B8 | 18.5 | Pv + Pi (0.21~0.15) | 1200 | 5 | 100% Ar | 10 | ○ | ◎ |
| Sample B9 | 13.4 | Pv + Pi (0.21~0.15) | 1200 | 5 | 95% + N$_2$ | 10 | XX | ○ |
| Sample B10 | 12.3 | Pv + Pi (0.21~0.15) | 1200 | 5 | 100% Ar | 5 | X | ○ |
| Sample B11 | 10.5 | OSF + Pv (0.22~0.20) | — | — | — | — | XX | X |
| Sample B12 | 13.2 | OSF + Pv + P (0.21~0.18) | — | — | — | — | XX | ○ |
| Sample B13 | 13.1 | OSF + Pv + Pi (0.21~0.18) | 1200 | 5 | 100% Ar | 10 | X | ○ |
| Sample B14 | 13.2 | OSF + Pv + Pi (0.21~0.18) | 1225 | 5 | 100% Ar | 10 | ○ | ○ |
| Sample B15 | 12.8 | OSF + Pv (0.22~0.20) | 1300 | 5 | 100% Ar | 10 | ○ | ○ |
| Sample B16 | 12.1 | OSF + Pv (0.22~0.20) | 1300 | 5 | 100% Ar + 5% O$_2$ | 5 | ○ | ○ |

Here, the results of the generation of slips or the slip lengths measured by the use of X-ray topography were defined as follows.
◎: slip length of 0 to 0.5 mm (S: Very Good)
○: slip length of 0.5 to 2 mm (A: Good)
Δ: slip length of 2 to 5 mm (B: Acceptable)
X: slip length of 5 to 10 mm (C: Not Acceptable)
XX: slip length of 10 to 15 mm (D: Poor)

The defect regions (Pv, Pi, and the like) shown in the table mean the defective regions included in the plane of a wafer. For example, when all of the OSF region, the Pv region, and the Pi region are included in the plane of a wafer, the value of G varies in the wafer diameter direction and the value of V/G varies in the plane. Accordingly, the value of V/G of each wafer has a range. Therefore, it is described in the table that the value of V/G has a range.

In Sample B1, slips were generated from oxygen precipitates in the Pv region, which is evaluated as NG.

In Samples B2 and B3, the vacancy-dominant region is not included in the outer peripheral portion and slips due to BMD were not generated, which is evaluated as OK.

In Sample B4, since the Pi region has a high oxygen concentration, oxygen precipitates were formed, which is evaluated as NG.

In Samples B5, B6, and B7, precipitation nuclei in the Pv region were eliminated by the RTA process, which is evaluated as OK.

In Sample B8, precipitation nuclei in the Pv region were eliminated by the RTA process and the generation of slips due to boat was much suppressed, which is evaluated as OK.

In Sample B9, a nitride film was formed in the atmosphere of N$_2$ and vacancies were injected to enhance the precipitation, which is evaluated as NG.

In Sample B10, vacancies were frozen by the rapid cooling to enhance the precipitation, which is evaluated as NG.

In Sample B11, slips were generated due to the precipitation in the OSF region and the Pv region. Since the oxygen concentration was low, slips due to boat scratches were generated, which is evaluated as NG.

In Sample B12, slips were generated due to the precipitation in the OSF region and the Pv region, which is evaluated as NG.

In Sample B13, nuclei in the OSF region were not eliminated by the RTA process, which is evaluated as NG.

In Samples B14, B15, and B16, nuclei in the OSF region were eliminated by the RTA process, which is evaluated as OK.

Experimental Example C (100) wafers were prepared from a silicon single crystal ingot with a diameter of 300 mm having the V region including void defects, which was pulled by setting the boron concentration and the initial oxygen concentration as described in Table 5, by the slicing and double-sided polishing (DSP) processes.

The conditions in the precipitation, dissolution, and thermal treatment process S33 were set as described as the RTA conditions in Table 5, the RTA process was performed on the prepared silicon wafers, and the annealing process at 1000° C. for 16 hours in a batch furnace was performed as the DZ process.

The thermal treatment in the device manufacturing process was simulated with the following conditions and the RTA thermal treatment as a compulsory thermal-stress test for generation of a deformation was performed on the wafers. The generation of slips due to the oxygen precipitates (BMD) was checked by the use of X-ray topography.

<Simulation Conditions in Device Manufacturing Process>
First step: 850° C., 30 minutes
Second step: 1000° C., 30 minutes
Third step: 1000° C., 60 minutes
Fourth step: 850° C., 30 minutes
(The temperature rising and falling rate of each step is 5° C./min)

The results were shown as RTA furnace stress loading test results (generation of slips due to the BMD) in Table 5.

Here, the BMD density was measured when the actualizing thermal treatment at 1000° C. for 16 hours was first performed and the Wright etching (of which the etching range is 2 μm) was then performed after the device simulation.

After the thermal treatment was performed by the use of a batch furnace under the following conditions as a stress loading test for the generation of scratches, the slip length was measured by the use of X-ray topography. The results were shown as vertical furnace stress loading test results (slip due to boat scratches) in Table 5.

<Vertical Furnace Thermal-stress Test Conditions>

The temperature rising and falling rate from 700° C. to 1150° C. was set to 8° C./min, the samples were retained at 1150° C. for 60 minutes, and then the samples were cooled to 700° C. at a temperature falling rate of 1.5° C./min.

In Samples C10, C11, C12, and C13, vacancies were frozen by the rapid cooling to enhance the precipitation, which is evaluated as NG.

In Sample C14, the oxygen precipitation nuclei formed at the time of pulling the crystal were stabilized in the N-doped wafer and the highest temperature in the RTA process was low. Accordingly, the oxygen precipitation nuclei were not eliminated and the BMD grew in the annealing process, which is evaluated as NG.

TABLE 5

| | Initial oxygen concentration ($\times$E17 atoms/cc) | Doped nitrogen concentration (pcs/cm$^2$) | LPD density before process (pcs/cm$^2$) | DZ temperature (° C.)/time (min) | LPD density after DZ process (pcs/cm$^2$) | RTA condition Temperature (° C.) | Time (sec) | atmosphere | Cooling rate (° C./sec) | BMD density after 1000° C./16 hr (/cm$^2$) | RTA furnace stress loading test result (slips due to BMD) | Vertical furnace stress loading test result (slips due to boat) |
|---|---|---|---|---|---|---|---|---|---|---|---|---|
| Sample C1 | 8.5 | Not doped | 42.8 | 1200/60 | 0.014 | — | — | — | — | <1.0E4 | ○ | X |
| Sample C2 | 13.5 | Not doped | 58.5 | 1200/60 | 0.016 | — | — | — | — | 2.60E + 05 | X | ○ |
| Sample C3 | 12.3 | Not doped | 10.2 | 1200/60 | 0.011 | 950 | 10 | 100% Ar | 10 | <1.0E4 | ○ | ○ |
| Sample C4 | 13.8 | Not doped | 38.3 | 1200/60 | 0.013 | 1150 | 10 | 100% Ar | 10 | <1.0E4 | ○ | ○ |
| Sample C5 | 16.7 | Not doped | 2.5 | 1200/60 | 0.026 | 1200 | 10 | 100% Ar | 10 | <1.0E4 | ○ | ○ |
| Sample C6 | 17.7 | Not doped | 8.9 | 1150/180 | 0.034 | 1200 | 5 | 99% Ar + 1% O$_2$ | 10 | <1.0E4 | ○ | ○ |
| Sample C7 | 17.5 | Not doped | 10.6 | 1200/60 | 0.022 | 1200 | 5 | 95% + 5% O$_2$ | 5 | <1.0E4 | ○ | ○ |
| Sample C8 | 15.3 | Not doped | 35.3 | 1200/60 | 0.021 | 1150 | 10 | 90% Ar + 10% N$_2$ | 10 | 4.50E + 04 | X | ○ |
| Sample C9 | 14.2 | Not doped | 34.2 | 1200/60 | 0.026 | 1150 | 10 | 100% Ar | 15 | 6.70E + 04 | X | ○ |
| Sample C10 | 13.8 | 1.20E + 13 | 28.5 | 1200/60 | 0.011 | 1200 | 5 | 95% + 5% O$_2$ | 10 | <1.0E4 | ○ | ○ |
| Sample C11 | 13.7 | 6.30E + 13 | 63.6 | 1150/180 | 0.016 | 1200 | 5 | 95% + 5% O$_2$ | 5 | <1.0E4 | ○ | ○ |
| Sample C12 | 13.1 | 5.40E + 14 | 5.3 | 1200/60 | 0.014 | 1200 | 5 | 95% + 5% O$_2$ | 10 | <1.0E4 | ○ | ○ |
| Sample C13 | 14.6 | 4.80E + 14 | 7.4 | 1200/60 | 0.022 | 1325 | 5 | 95% + 5% O$_2$ | 10 | <1.0E4 | ○ | ○ |
| Sample C14 | 13.5 | 4.00E + 13 | 35.6 | 1200/60 | 0.030 | 1150 | 10 | 95% + 5% O$_2$ | 10 | 2.30E + 05 | X | ○ |

Here, the results of the generation of slips or the slip lengths measured by the use of X-ray topography were defined as follows.

○: slip length of 0.5 to 2 mm (A: Good)
Δ: slip length of 2 to 5 mm (B: Acceptable)
X: slip length of 5 to 10 mm (C: Not Acceptable)

In Sample C1, the formation of BMD in the high-temperature annealing process was suppressed due to the use of a low-oxygen substrate and slips due to BMD were not generated in the RTA process after the annealing process. However, since the substrate had a low oxygen concentration, slips were generated in the vertical furnace stress loading test after the annealing process, which is evaluated as NG.

In Sample C2, BMD was formed in the high-temperature annealing process and slips were generated in the RTA process. The oxygen concentration was high and the formation of slips due to boat scratches in the vertical furnace was suppressed, which is evaluated as NG.

In Sample C3, the oxygen precipitation nuclei formed at the time of pulling a crystal were dissolved in the RTA process. BMD was not re-formed in the subsequent annealing process, which is evaluated as OK.

In Samples C4, C5, C6, and C7, the same is true, which is evaluated as OK.

In Sample C8, vacancies were injected by the formation of a nitride film in the RTA process and the precipitation nuclei were stabilized, which is evaluated as NG.

In Sample C9, vacancies were frozen by the rapid cooling in the RTA process and precipitation nuclei were stabilized. BMD grew in the high-temperature annealing process, which is evaluated as NG.

Experimental Example D (100) wafers were prepared from a silicon single crystal ingot with a diameter of 300 mm, which was pulled by setting the boron concentration (resistivity) to 12 Ωcm and setting the initial oxygen concentration as described in Table 6, by the slicing and double-sided polishing (DSP) processes.

The thermal treatment in the device manufacturing process was simulated with the following conditions and the RTA thermal treatment as a compulsory thermal-stress test for generation of a deformation was performed on the wafers. The generation of slips due to the oxygen precipitates (BMD) was checked by the use of X-ray topography.

<Simulation Conditions in Device Manufacturing Process>

First step: 850° C., 30 minutes
Second step: 1000° C., 30 minutes
Third step: 1000° C., 60 minutes
Fourth step: 850° C., 30 minutes
(The temperature rising and falling rate of each step is 5° C./min)

The results were shown as RTA furnace stress loading test results (generation of slips due to the BMD) in Table 6.

Here, the BMD density was measured when the actualizing thermal treatment at 1000° C. for 16 hours was first performed and the Wright etching (of which the etching range is 2 μm) was then performed after the device simulation.

After the thermal treatment was performed by the use of a batch furnace under the following conditions as a stress loading test for the generation of scratches, the slip length was measured by the use of X-ray topography. The results were shown as vertical furnace stress loading test results (slip due to boat scratches) in Table 6.

<Vertical Furnace Thermal-stress Test Conditions>

The temperature rising and falling rate from 700° C. to 1150° C. was set to 8° C./min, the samples were retained at 1150° C. for 60 minutes, and then the samples were cooled to 700° C. at a temperature falling rate of 1.5° C./min.

TABLE 6

| | Pv region is not included in outer edge, oxygen concentration is defined Initial oxygen concentration (×E17 atoms/cc) | Defect region (V/G value) | BMD density within 20 mm from outer edge after precipitation process (/cm$^2$) | After thermal simulation of device | |
|---|---|---|---|---|---|
| | | | | RTA furnace stress loading test result (slips due to BMD) | Vertical furnace stress loading test result (slips due to boat) |
| Sample D1 | 10.1 | Pv region is present (0.22) | 5.20E + 04 | X | X |
| Sample D2 | 13.5 | Pv region is present (0.21) | 6.50E + 05 | X | ○ |
| Sample D3 | 12.3 | Pi region (0.18) | <1e4 | ○ | ○ |
| Sample D4 | 13.8 | Pi region (0.19) | <1e4 | ○ | ○ |

Here, the results of the generation of slips or the slip lengths measured by the use of X-ray topography were defined as follows.

O: slip length of 0.5 to 2 mm (A: Good)
Δ: slip length of 2 to 5 mm (B: Acceptable)
X: slip length of 5 to 10 mm (C: Not Acceptable)

In the BMD density (pcs/cm$^2$) after the precipitation process within 20 mm from the outer peripheral edge in the polished wafers, <1e4 meant that it was equal to or less than an actual detection limit.

In Sample D1, the thermal stress in the outer peripheral edge was great in the RTA furnace and slips due to BMD were generated. The oxygen concentration was low in the vertical furnace and slips were generated from boat scratches, which is evaluated as NG.

In Sample D2, the oxygen concentration was high, the generation of slips due to boat scratches was suppressed, and slips due to BMD were generated, which is evaluated as NG.

In Samples D3 and D4, the vacancy-dominant region was not included in the outer peripheral edge and slips due to BMD were not generated, which is evaluated as OK.

REFERENCE SIGNS LIST

W: SILICON WAFER

The invention claimed is:

1. A method of manufacturing a silicon epitaxial wafer which is provided to a semiconductor device manufacturing process having a thermal treatment process of which the highest temperature ranges from 1050° C. to the melting point of silicon and of which the temperature rising and falling rate ranges from 150° C./sec to 10000° C./sec, the method comprising:
   an epitaxial process of causing an epitaxial layer to grow on the surface of a substrate, which is doped with boron so as to have resistivity of 0.02 Ωcm to 1 kΩcm and of which the initial oxygen concentration Oi is in the range of $14.0 \times 10^{17}$ to $22 \times 10^{17}$ atoms/cm$^3$ ASTM F 121, 1970-1979 published by American Society for Testing and Materials International); and
   an oxygen precipitation nuclei dissolution process of treating a wafer in the treatment temperature range of 1150° C. to 1300° C., the retention time range of 5 sec to 1 min, and the temperature-falling rate range of 10° C./sec to 0.1° C./sec,
   wherein the oxygen precipitation nuclei dissolution process is performed before or after the epitaxial process,
   the thermal treatment process is applied to only an outermost surface layer of the silicon epitaxial wafer,
   the oxygen precipitates density is equal to or less than $5 \times 10^4$ pcs/cm$^2$ in the silicon epitaxial wafer, and
   the wafer includes a front surface and back surface, both having a flat main surface, a front sloped chamfered portion having an angle θ1, which is in a range of from 10° to 50°, a back sloped chamfered portion having an angle θ2, which is in a range of from 10° to 30°, and front and back curved portions, which connect the front and back chamfered portions to a peripheral edge of the wafer.

2. A method of manufacturing a silicon epitaxial wafer which is provided to a semiconductor device manufacturing process having a thermal treatment process of which the highest temperature ranges from 1050° C. to the melting point of silicon and of which the temperature rising and falling rate ranges from 150° C./sec to 10000° C./sec, the method comprising:
   an epitaxial process of causing an epitaxial layer to grow on the surface of a substrate, which is doped with nitrogen of $1 \times 10^{13}$ to $5 \times 10^{14}$ atoms/cm$^3$; and
   an oxygen precipitation nuclei dissolution process of treating a wafer in the treatment temperature range of 1200° C. to 1300° C., the retention time range of 5 sec to 1 min, and the temperature-falling rate range of 10° C./sec to 0.1° C./sec after the epitaxial process,
   wherein the thermal treatment process is applied to only an outermost surface layer of the silicon epitaxial wafer,
   the oxygen precipitates density is equal to or less than $5 \times 10^4$ pcs/cm$^2$ in the silicon epitaxial wafer, and
   the wafer includes a front surface and back surface, both having a flat main surface, a front sloped chamfered portion having an angle θ1, which is in a range of from 10° to 50°, a back sloped chamfered portion having an angle θ2, which is in a range of from 10° to 30°, and front and back curved portions, which connect the front and back chamfered portions to a peripheral edge of the wafer.

3. The method of manufacturing a silicon epitaxial wafer according to claim 1, wherein the treatment atmosphere in the oxygen precipitation nuclei dissolution process is set to an atmosphere of non-oxidizing gas not containing nitrogen.

4. The method of manufacturing a silicon epitaxial wafer according to claim 1, wherein the treatment atmosphere in the oxygen precipitation nuclei dissolution process is set to a mixed atmosphere of non-oxidizing gas not containing 1% or more of nitrogen and oxygen gas.

5. A silicon epitaxial wafer manufactured by the method of manufacturing a silicon epitaxial wafer according to claim 1.

6. The method of manufacturing a silicon epitaxial wafer according to claim 2, wherein the treatment atmosphere in the oxygen precipitation nuclei dissolution process is an atmosphere of a non-oxidizing gas not containing nitrogen.

7. The method of manufacturing a silicon epitaxial wafer according to claim 2, wherein the treatment atmosphere in the oxygen precipitation nuclei dissolution process is a mixed atmosphere of a non-oxidizing gas not containing 1% or more of nitrogen and oxygen gas.

8. A silicon epitaxial wafer manufactured by the method of manufacturing the silicon epitaxial wafer according to claim 2.

* * * * *